(12) United States Patent
Takahashi et al.

(10) Patent No.: US 8,508,027 B2
(45) Date of Patent: Aug. 13, 2013

(54) SEMICONDUCTOR DEVICE AND MANUFACTURING METHOD THEREOF

(75) Inventors: Hidekazu Takahashi, Isehara (JP); Daiki Yamada, Isehara (JP); Kyosuke Ito, Hadano (JP); Eiji Sugiyama, Atsugi (JP); Yoshitaka Dozen, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 286 days.

(21) Appl. No.: 12/555,832

(22) Filed: Sep. 9, 2009

(65) Prior Publication Data

US 2009/0321902 A1    Dec. 31, 2009

Related U.S. Application Data

(62) Division of application No. 11/436,090, filed on May 18, 2006, now Pat. No. 7,605,056.

(30) Foreign Application Priority Data

May 31, 2005   (JP) ................................ 2005-158423

(51) Int. Cl.
    *H01L 23/552*   (2006.01)
(52) U.S. Cl.
    USPC ........... 257/678; 257/679; 257/690; 257/700; 257/E23.01; 438/458
(58) Field of Classification Search
    USPC ................... 438/458; 257/679, 690, E23.01, 257/678, 700
    See application file for complete search history.

(56) References Cited

U.S. PATENT DOCUMENTS

| 5,132,248 A | 7/1992 | Drummond et al. |
| 5,151,389 A | 9/1992 | Zappella |

(Continued)

FOREIGN PATENT DOCUMENTS

| EP | 0 578 083 | 1/1994 |
| EP | 1 453 088 | 9/2004 |

(Continued)

OTHER PUBLICATIONS

Knickerbocker et al., "Development of next-generation system-on-package (SOP) technology based on silicon carriers with fine-pitch chip interconnection," Journal of IBM Research and Development, Sep. 2005, vol. 49, No. 4/5, pp. 725-753.

(Continued)

*Primary Examiner* — Daniel Whalen
*Assistant Examiner* — Suberr Chi
(74) *Attorney, Agent, or Firm* — Eric J. Robinson; Robinson Intellectual Property Law Office, P.C.

(57) ABSTRACT

The semiconductor device of the invention includes a transistor, an insulating layer provided over the transistor, a first conductive layer (corresponding to a source wire or a drain wire) electrically connected to a source region or a drain region of the transistor through an opening portion provided in the insulating layer, a first resin layer provided over the insulating layer and the first conductive layer, a layer containing conductive particles which is electrically connected to the first conductive layer through an opening portion provided in the first resin layer, and a substrate provided with a second resin layer and a second conductive layer serving as an antenna. In the semiconductor device having the above-described structure, the second conductive layer is electrically connected to the first conductive layer with the layer containing conductive particles interposed therebetween. In addition, the second resin layer is provided over the first resin layer.

39 Claims, 16 Drawing Sheets

(56) References Cited

U.S. PATENT DOCUMENTS

| | | | |
|---|---|---|---|
| 5,578,527 | A | 11/1996 | Chang et al. |
| 5,757,456 | A | 5/1998 | Yamazaki et al. |
| 5,866,540 | A | 2/1999 | Jonczyk et al. |
| 6,127,199 | A | 10/2000 | Inoue et al. |
| 6,294,401 | B1 | 9/2001 | Jacobson et al. |
| 6,544,430 | B2 | 4/2003 | McCormack et al. |
| 6,592,783 | B2 | 7/2003 | Kumakura et al. |
| 6,682,963 | B2 | 1/2004 | Ishikawa |
| 6,818,920 | B2 | 11/2004 | De Leeuw et al. |
| 6,849,877 | B2 | 2/2005 | Yamazaki et al. |
| 6,887,650 | B2 | 5/2005 | Shimoda et al. |
| 6,940,408 | B2 | 9/2005 | Ferguson et al. |
| 7,017,822 | B2 | 3/2006 | Aisenbrey |
| 7,045,442 | B2 | 5/2006 | Maruyama et al. |
| 7,060,153 | B2 | 6/2006 | Yamazaki et al. |
| 7,109,071 | B2 | 9/2006 | Ishikawa |
| 7,271,076 | B2 | 9/2007 | Yamazaki et al. |
| 7,323,762 | B2 | 1/2008 | Lai et al. |
| 7,354,801 | B2 | 4/2008 | Sugiyama et al. |
| 7,408,193 | B2 | 8/2008 | Ishikawa |
| 7,452,786 | B2 | 11/2008 | Dozen et al. |
| 7,476,575 | B2 | 1/2009 | Tsurume et al. |
| 7,518,692 | B2 | 4/2009 | Yamazaki et al. |
| 7,534,702 | B2 | 5/2009 | Arao et al. |
| 7,566,640 | B2 | 7/2009 | Yamazaki et al. |
| 7,632,721 | B2 | 12/2009 | Yamazaki et al. |
| 7,642,555 | B2 | 1/2010 | Ishikawa |
| 2004/0129960 | A1 | 7/2004 | Maruyama et al. |
| 2004/0147113 | A1 | 7/2004 | Yamazaki et al. |
| 2004/0152276 | A1 | 8/2004 | Nishimura |
| 2004/0164302 | A1 | 8/2004 | Arai et al. |
| 2005/0017373 | A1 | 1/2005 | Nishikawa et al. |
| 2005/0026423 | A1 | 2/2005 | Yamazaki |
| 2005/0151271 | A1 | 7/2005 | Tatsuzawa et al. |
| 2005/0168339 | A1* | 8/2005 | Arai et al. ............ 340/572.8 |
| 2006/0011288 | A1 | 1/2006 | Watanabe et al. |
| 2006/0055314 | A1* | 3/2006 | Nakamura et al. ......... 313/500 |
| 2006/0270195 | A1 | 11/2006 | Yamada et al. |
| 2007/0161159 | A1 | 7/2007 | Yamazaki et al. |
| 2007/0176622 | A1 | 8/2007 | Yamazaki |
| 2007/0196999 | A1 | 8/2007 | Tamura et al. |
| 2008/0042168 | A1 | 2/2008 | Watanabe et al. |
| 2008/0044940 | A1 | 2/2008 | Watanabe et al. |

FOREIGN PATENT DOCUMENTS

| | | |
|---|---|---|
| JP | 4-213833 | 8/1992 |
| JP | 04-307489 A | 10/1992 |
| JP | 10-302037 A | 11/1998 |
| JP | 2000-200334 | 7/2000 |
| JP | 2002-155196 A | 5/2002 |
| JP | 2002-164354 A | 6/2002 |
| JP | 2003-529223 | 9/2003 |
| JP | 2004-221284 A | 8/2004 |
| JP | 2004-224762 | 8/2004 |
| JP | 2004-224803 | 8/2004 |
| JP | 2004-282050 | 10/2004 |
| JP | 2005-037895 A | 2/2005 |
| JP | 2005-056362 A | 3/2005 |
| JP | 2005-235017 | 9/2005 |
| WO | WO-01/073845 | 10/2001 |
| WO | WO 01/75772 | 10/2001 |
| WO | WO-2005/057658 | 6/2005 |
| WO | WO-2005/076358 | 8/2005 |
| WO | WO 2005/086088 | 9/2005 |
| WO | WO-2006/001287 | 1/2006 |
| WO | WO 2006/011664 | 2/2006 |
| WO | WO 2006/022169 | 3/2006 |
| WO | WO 2006/024980 | 3/2006 |

OTHER PUBLICATIONS

Yim et al., "Effect of Conductive Particle Properties on the Reliability of Anisotropic Conductive Film for Chip-on-Glass Applications," IEEE Transactions on Electronics Packaging and Manufacturing, Oct. 2007, vol. 30, No. 4, pp. 306-312.

* cited by examiner

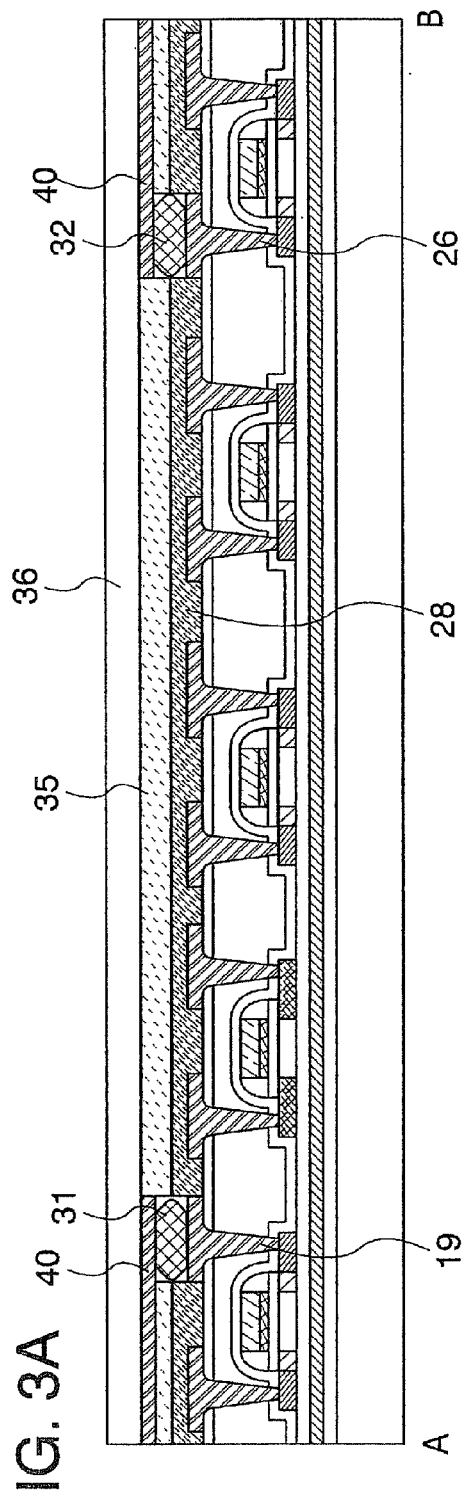
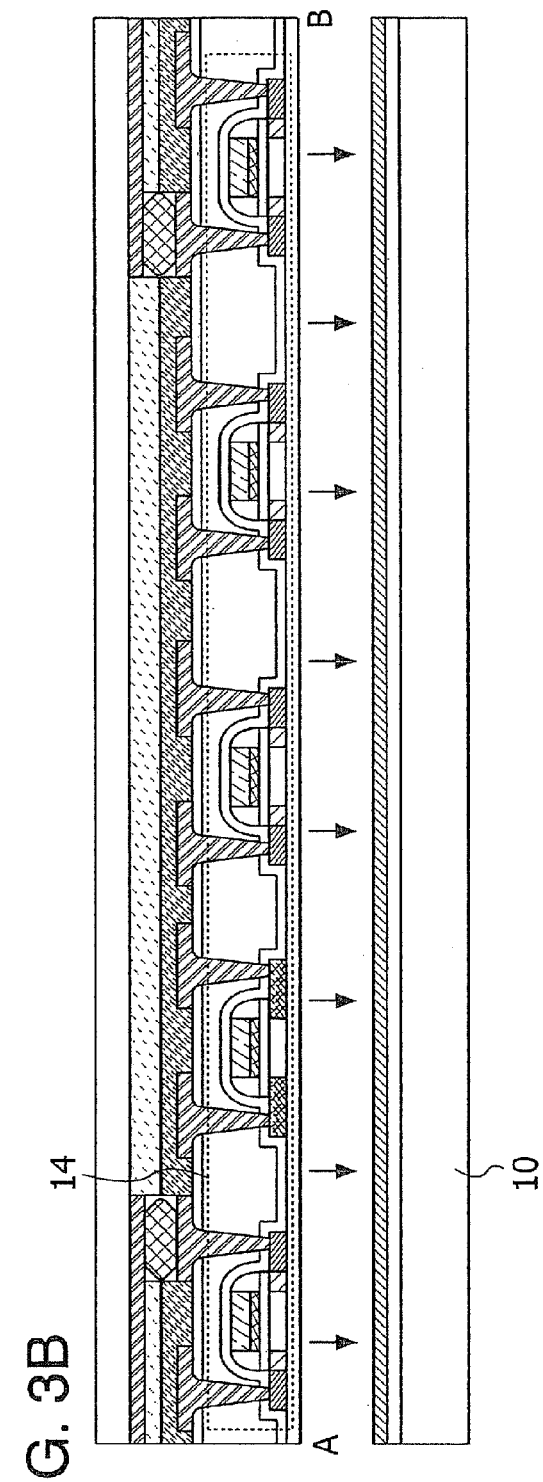
FIG. 3A
FIG. 3B

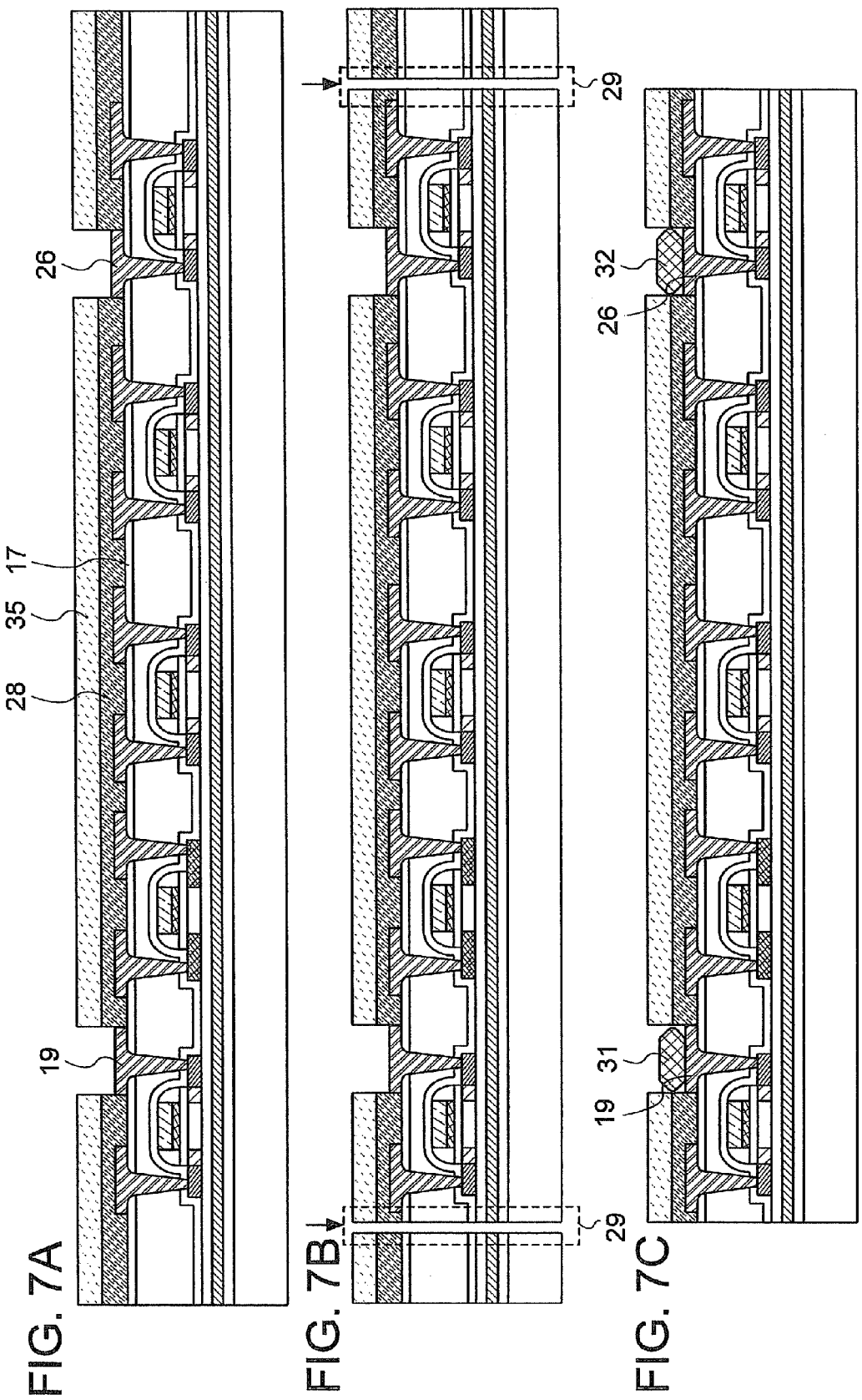

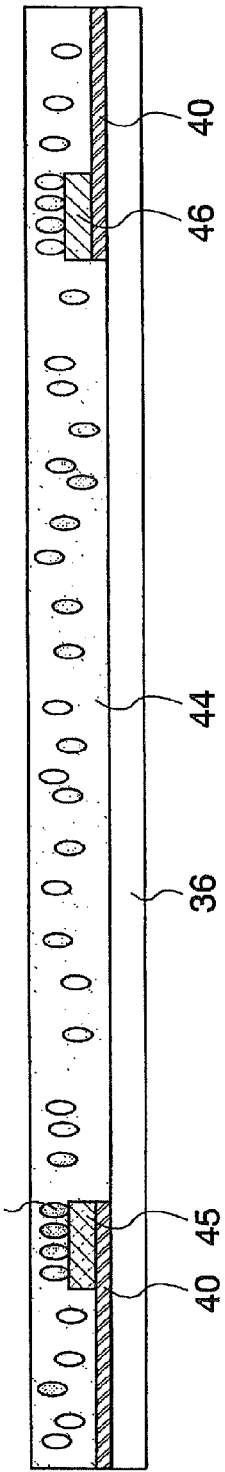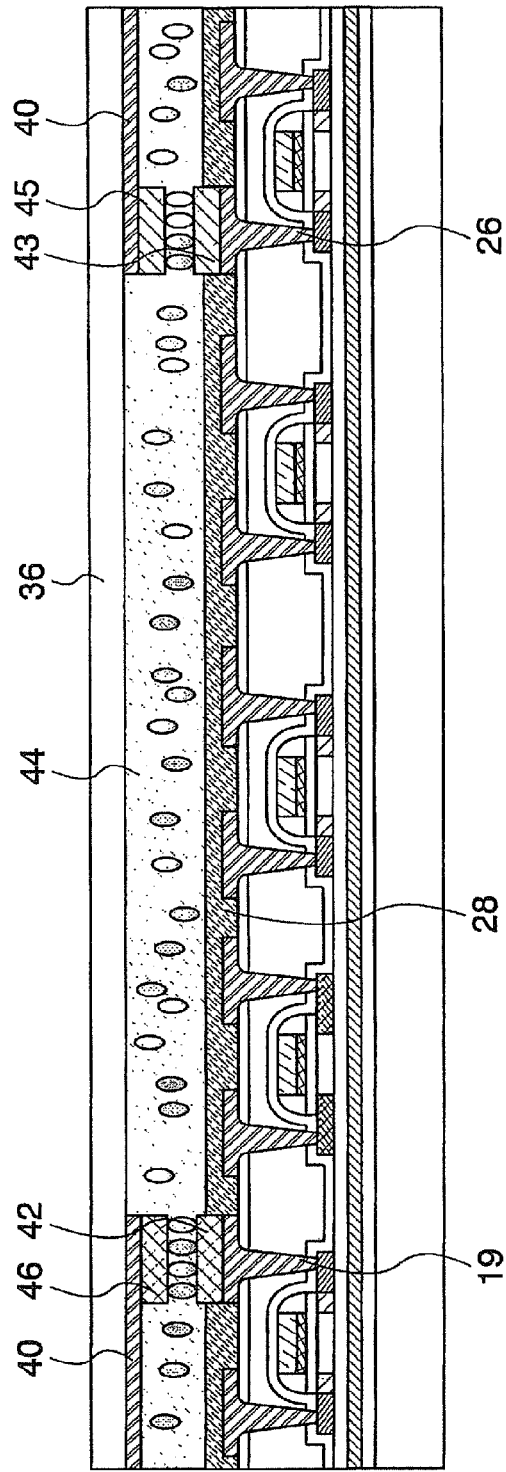

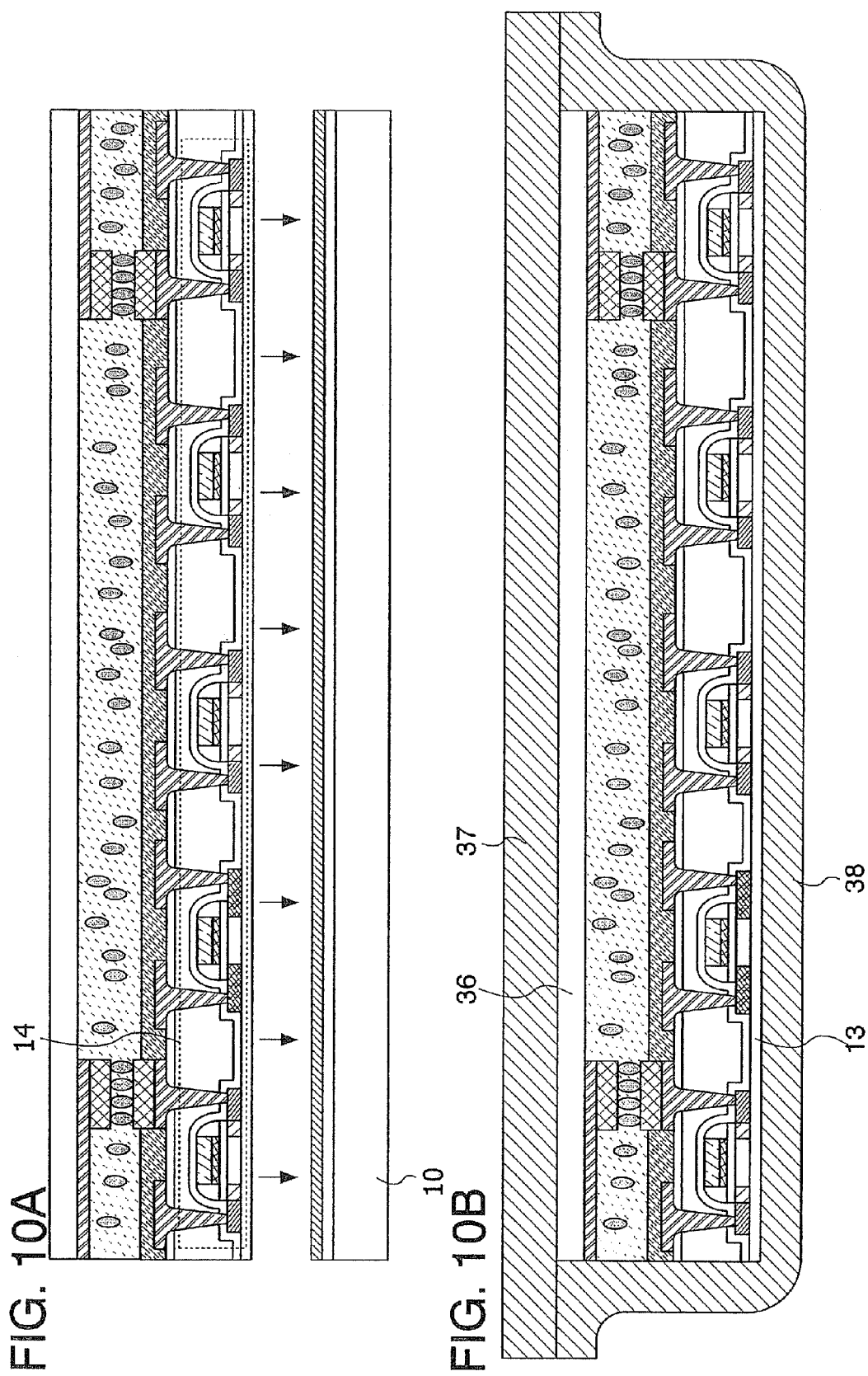

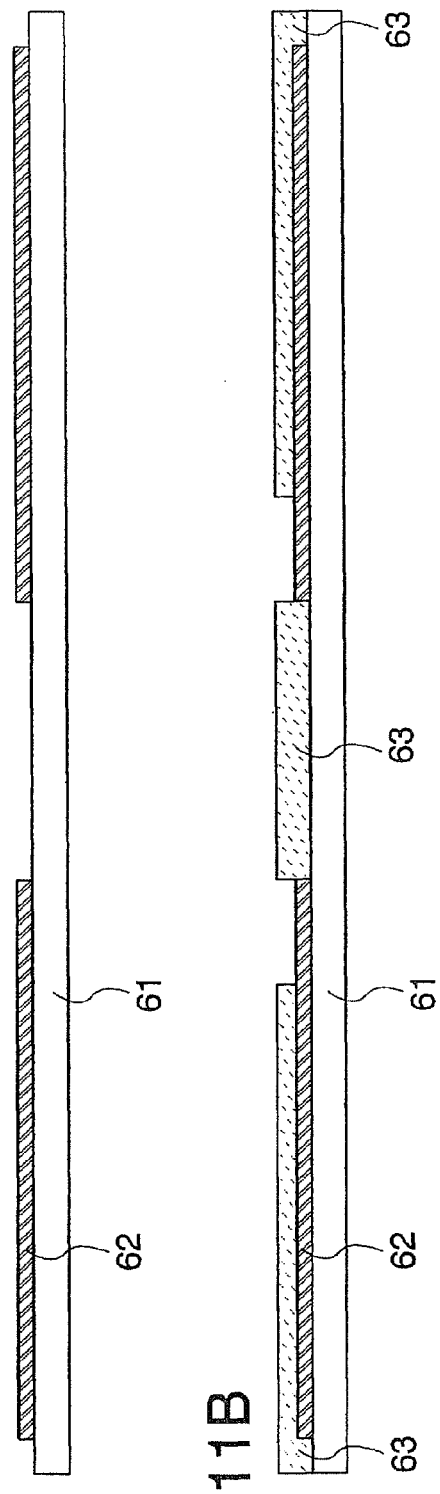

FIG. 16A
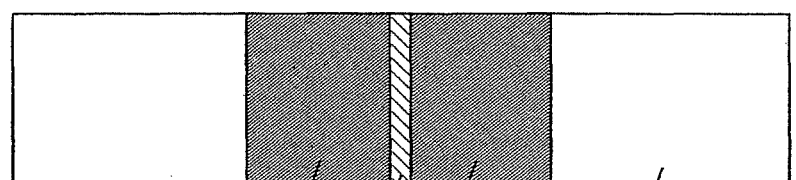
FIG. 16B
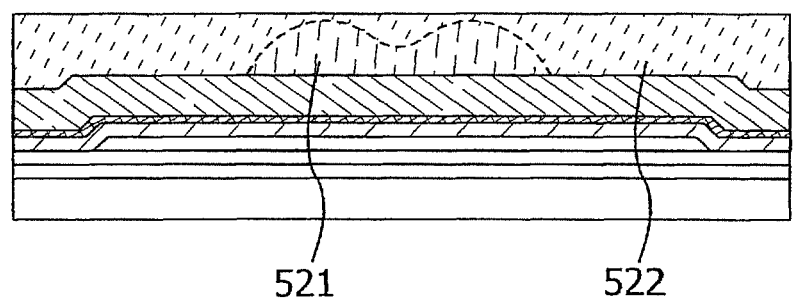

SEMICONDUCTOR DEVICE AND MANUFACTURING METHOD THEREOF

BACKGROUND OF THE INVENTION

1. Field of the Invention

The present invention relates to a semiconductor device and a manufacturing method thereof. The semiconductor device refers to a semiconductor device including a transistor.

2. Description of the Related Art

In recent years, a semiconductor device capable of sending and receiving electromagnetic waves has been developed. Such a semiconductor device is called an RFID (Radio Frequency IDentification), an RF chip, an RF tag, an IC chip, an IC tag, an IC label, a wireless chip, a wireless tag, an electronic chip, an electronic tag, a wireless processor, a wireless memory, or the like (Reference 1: Japanese Patent Laid-Open No. 2004-282050, for example), and it has already been introduced into some fields.

The semiconductor device capable of sending and receiving electromagnetic waves necessarily includes an antenna. In addition, there are broadly two cases, which are a case of using a substrate provided with both a transistor and an antenna, and a case of using a first substrate provided with a transistor and a second substrate provided with an antenna. These two types are separately used, depending on the frequency band in many cases. For example, in order to increase a communication range, an area for an antenna needs to be large. Accordingly, in such a case, the first substrate provided with a transistor and the second substrate provided with an antenna are used.

SUMMARY OF THE INVENTION

A semiconductor device capable of sending and receiving electromagnetic waves is, in many cases, embedded into or attached to an article so as to be used for sophistication, multifunction, or high added value of a system. In such a situation, it is an object of the present invention to provide a semiconductor device which is further reduced in size, thickness, and weight, so as to easily mount the semiconductor device onto an article and to start the introduction of the semiconductor device into more fields.

It is a further object of the present invention to provide a manufacturing method of a semiconductor device which includes a first substrate provided with a transistor and a second substrate provided with an antenna, with reduced time and improved yield.

One feature of the semiconductor device of the invention is to include a transistor, an insulating layer provided over the transistor, a first conductive layer (corresponding to a source wire or a drain wire) electrically connected to a source region or a drain region of the transistor through an opening portion provided in the insulating layer, a first resin layer selectively provided over the insulating layer and the first conductive layer, a layer containing conductive particles which is electrically connected to the first conductive layer through an opening portion provided in the first resin layer, and a substrate provided with a second resin layer and a second conductive layer serving as an antenna.

One feature of the semiconductor device having the above-described structure is that the second conductive layer is electrically connected to the first conductive layer with the layer containing conductive particles interposed therebetween. In addition, the second resin layer is provided over the first resin layer.

Another feature of the semiconductor device having the above-described structure is that the second conductive layer is electrically connected to the first conductive layer with the second resin layer and the layer containing conductive particles interposed therebetween. In addition, the second resin layer is provided over the first resin layer.

One feature of the semiconductor device of the invention is to include a transistor, an insulating layer provided over the transistor, a first conductive layer (corresponding to a source wire or a drain wire) electrically connected to a source region or a drain region of the transistor through an opening portion provided in the insulating layer, a first resin layer selectively provided over the insulating layer and the first conductive layer, a first layer containing first conductive particles which is formed so as to be in contact with the first conductive layer through an opening portion provided in the first resin layer, and a substrate. A second resin layer, a second conductive layer serving as an antenna, and a second layer containing second conductive particles are provided over the substrate. The second conductive layer is electrically connected to the first conductive layer with the second layer containing second conductive particles, the second resin layer, and the first layer containing first conductive particles interposed therebetween. The second resin layer is provided over the first resin layer.

One feature of the semiconductor device having the above-described structure is that the layer containing conductive particles contains silver particles.

One feature of a manufacturing method of a semiconductor device of the invention is to include the steps of forming a release layer over a first substrate, forming a transistor over the release layer, forming an insulating layer over the transistor, forming an opening portion in the insulating layer and forming a first conductive layer electrically connected to a source region or a drain region of the transistor, and selectively forming a first resin layer over the insulating layer and the first conductive layer.

Subsequently to the above steps, the manufacturing method of the semiconductor device includes the steps of forming an opening portion so as to expose at least a part of the release layer, selectively forming a layer containing conductive particles so as to be in contact with the first conductive layer, selectively forming a second resin layer over a second substrate provided with a second conductive layer serving as an antenna, electrically connecting the first conductive layer to the second conductive layer through the layer containing conductive particles, and separating a stack including the transistor from the first substrate by using the second substrate.

Alternatively, subsequently to the above steps, the manufacturing method of the semiconductor device includes the steps of selectively forming a second resin layer over the first resin layer, forming an opening portion so as to expose at least a part of the release layer, forming a layer containing conductive particles so as to be in contact with the first conductive layer, electrically connecting the first conductive layer to the second conductive layer which serves as an antenna and is provided over a second substrate with the layer containing conductive particles interposed therebetween, and separating a stack including the transistor from the first substrate by using the second substrate.

One feature of a manufacturing method of a semiconductor device of the invention is to include the steps of forming a release layer over a first substrate, forming a transistor over the release layer, forming an insulating layer over the transistor, forming an opening portion in the insulating layer and forming a first conductive layer electrically connected to a source region or a drain region of the transistor, and selectively forming a first resin layer over the insulating layer and the first conductive layer.

Subsequently to the above-described steps, the manufacturing method of the semiconductor device includes the steps of selectively forming a layer containing conductive particles so as to be in contact with the first conductive layer, forming an opening portion so as to expose at least a part of the release layer, selectively forming a second resin layer over a second substrate provided with a second conductive layer serving as an antenna, electrically connecting the first conductive layer to the second conductive layer with the second resin layer and the layer containing conductive particles interposed therebetween, and separating a stack including the transistor from the first substrate by using the second substrate with physical force.

Alternatively, subsequently to the above-described steps, the manufacturing method of the semiconductor device includes the steps of selectively forming a first layer containing first conductive particles so as to be in contact with the first conductive layer, forming an opening portion so as to expose at least a part of the release layer, forming a second layer containing second conductive particles and a second resin layer over a second substrate provided with a second conductive layer serving as an antenna, electrically connecting the first conductive layer to the second conductive layer with the first layer containing first conductive particles interposed therebetween, the second layer containing second conductive particles, and the second resin layer, and separating a stack including the transistor from the first substrate by using the second substrate.

Another feature of the manufacturing method of the semiconductor device of the invention is to form a layer containing tungsten or molybdenum as the release layer.

The opening portion by which the part of the release layer is exposed may be formed by using a laser beam. At that time, solid-state laser having a wavelength of 1 to 380 nm, which is in an ultraviolet region, may be used as the laser. Preferably, Nd:YVO$_4$ laser having a wavelength of 1 to 380 nm is used because it is more easily absorbed in a substrate and ablation processing is easier to be performed, compared with other laser beams having a longer wavelength. Thus, according to the present invention with the use of laser beam irradiation, a plurality of steps as in photolithography is not required to form an opening portion. Accordingly, manufacturing time can be reduced and yield can be improved.

In a mode of the invention, an exposed part of the release layer is formed and the stack including the transistor is separated from the first substrate using the second substrate, from the exposed part as an origin and at an inside of the release layer or at a boundary between the release layer and a layer in contact with the release layer. By using the second substrate in such a way, the stack including the transistor can be easily separated in short time.

In the case of using a substrate provided with a transistor and a substrate provided with an antenna, a first substrate provided with a stack including a transistor is attached to a second substrate provided with an antenna in many cases. However, one feature of the invention is to provide a semiconductor device formed by separating the stack including the transistor from the first substrate and attaching the separated stack to the second substrate. By the above-described feature, miniaturization, thinning, and lighter weight can be realized.

In the invention, a first conductive layer electrically connected to a source region or a drain region of a transistor over a first substrate is connected to a second conductive layer over a second substrate, and a stack including the transistor is separated from the first substrate by using the second substrate. In other words, one feature of the invention is concurrently (almost concurrently) performing a step of connecting the first conductive layer to the second conductive layer and a step of separating the stack including the transistor from the first substrate. By the above-described feature, manufacturing time can be reduced and yield can be improved. Further, by using the second substrate in the step of separating the stack from the first substrate, separation can be easily performed in a short time.

BRIEF DESCRIPTION OF DRAWINGS

In the accompanying drawings:

FIGS. 3A and 3B show a semiconductor device of the invention and a manufacturing method thereof;

FIGS. 7A to 7C show a semiconductor device of the invention and a manufacturing method thereof;

FIGS. 9A and 9B show a semiconductor device of the invention and a manufacturing method thereof;

FIGS. 10A and 10B show a semiconductor device of the invention and a manufacturing method thereof;

FIGS. 11A and 11B show semiconductor devices of the invention and a manufacturing method thereof;

FIGS. 16A and 16B show a manufacturing method of a transistor.

DETAILED DESCRIPTION OF THE INVENTION

Figure 1A:
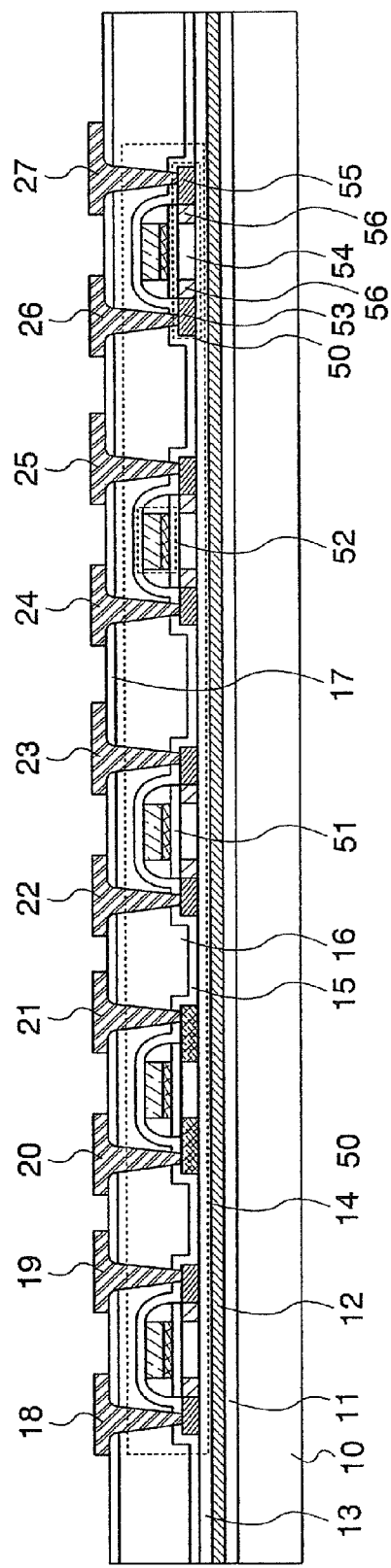
FIGS. 1A and 1B show a semiconductor device of the invention and a manufacturing method thereof.

Embodiment modes and embodiments of the present invention will be described in detail with reference to the drawings. Note that it is easily understood by those skilled in the art that the invention is not limited by the following descriptions and various changes may be made in forms and details without departing from the spirit and the scope of the invention. Therefore, the invention should not be limited to descriptions of the embodiment modes and embodiments below. The same reference numerals are commonly given to the same components or components having the same function in the structure of the invention.

Embodiment Mode 1

A manufacturing method of a semiconductor device of the invention will be explained with reference to cross sectional views of FIG. 1A to FIG. 4 and top views of FIG. 5A to FIG. 6C. Note that FIG. 1B, FIG. 2A, and FIG. 2B correspond to cross sections taken along line A-B of the top views of FIG. 5A, FIG. 5B, and FIG. 5C, respectively. Further, FIG. 2C and FIG. 3B correspond to cross sections taken along line A-B of top views of FIGS. 6B and 6C, respectively.

First, an insulating layer 11 is formed over a surface of a substrate 10 (FIG. 1A). Next, a release layer 12 is formed over the insulating layer 11. Then, an insulating layer 13 is formed over the release layer 12.

The substrate 10 is a glass substrate, a plastic substrate, a silicon substrate, a quartz substrate, or the like. As the substrate 10, a glass substrate or a plastic substrate is preferably used. This is because a glass substrate or a plastic substrate having a side of 1 meter or more or having a predetermined shape such as a square can be easily manufactured. Thus, when a glass substrate or a plastic substrate which has a square shape and has a side of 1 meter or more is used for example, productivity can be drastically improved. This is a great advantage compared with the case of using a silicon substrate having a circular shape with a diameter of about 30 centimeters at most.

The insulating layers 11 and 13 are formed by a plasma CVD method or a sputtering method by using oxide or nitride of silicon, oxide of silicon containing nitrogen, nitride of silicon containing oxygen, or the like. The insulating layer 11 prevents an impurity element from entering an upper layer from the substrate 10. The insulating layer 11 is not formed if it is not required.

The release layer 12 is formed with a single layer or a stacked layer formed by a plasma CVD method or a sputtering method by using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), iridium (Ir), or silicon (Si) or an alloy material or a compound material containing the above described element as its main component. The crystal structure of the layer containing silicon may be any of the amorphous, microcrystalline, or polycrystalline structure.

In the case where the release layer 12 has a single-layer structure, a tungsten layer, a molybdenum layer, or a layer containing a mixture of tungsten and molybdenum is formed preferably. Alternatively, a layer containing oxide, oxynitride, or nitride oxide of tungsten, a layer containing oxide, oxynitride, or nitride oxide of molybdenum, or a layer containing oxide, oxynitride, or nitride oxide of a mixture of tungsten and molybdenum may be formed. It is to be noted that the mixture of tungsten and molybdenum is an alloy of tungsten and molybdenum, for example.

In the case where the release layer 12 has a stack structure, a tungsten layer, a molybdenum layer, or a layer containing a mixture of tungsten and molybdenum is formed as a first layer. As a second layer, a layer containing oxide, nitride, oxynitride, or nitride oxide of tungsten, a layer containing oxide or oxynitride of molybdenum, or a layer containing oxide or oxynitride of a mixture of tungsten and molybdenum is formed.

When a stack of a layer containing tungsten and a layer containing oxide of tungsten is formed as the release layer 12, the layer containing tungsten may be formed as the release layer 12 and a layer containing oxide of silicon may be formed as the insulating layer 13 thereover so that a layer containing oxide of tungsten is formed at the interface between the layer containing tungsten and the layer containing oxide of silicon. This also applies to the case of forming a layer containing nitride, oxynitride, or nitride oxide of tungsten or the like. In such a case, after a layer containing tungsten is formed, a layer containing nitride of silicon, a silicon nitride layer containing oxygen, or a silicon oxide layer containing nitrogen may be formed thereover.

Subsequently, a plurality of transistors 14 is formed over the insulating layer 13. Then, insulating layers 15 to 17 are formed over the plurality of transistors 14. In addition, opening portions are formed in the insulating layers 15 to 17 and conductive layers 18 to 27 are formed, which are each connected to a source region or a drain region of the plurality of transistors 14.

Each of the plurality of transistors 14 includes a semiconductor layer 50, a gate insulating layer 51, and a conductive layer 52 serving as a gate electrode. The semiconductor layer 50 includes impurity regions 53 and 55 serving as a source region or a drain region, and a channel forming region 54. The impurity regions 53 and 55 are doped with an impurity element which imparts n-type or p-type conductivity. Specifically, the impurity regions 53 and 55 are doped with an impurity element imparting n-type conductivity (an element belonging to group 15 of the periodic table, such as phosphorus (P) or arsenic (As)) or an impurity element imparting p-type conductivity (an element belonging to group 13 of the periodic table, for example, boron (B)). The impurity regions 56 are LDD (Lightly Doped Drain) regions. Each of the plurality of transistors 14 may have either of a top-gate structure in which the gate insulating layer 51 is formed over the semiconductor layer 50 and the conductive layer 52 is formed over the gate insulating layer 51, or a bottom-gate structure in which the gate insulating layer 51 is formed over the conductive layer 52 and the semiconductor layer 50 is formed over the gate insulating layer 51.

Note that in the structure shown in the drawing, only the plurality of transistors 14 is formed; however, the invention is not limited thereto. An element to be provided over the substrate 10 may be appropriately changed in accordance with the usage of the semiconductor device. For example, in the case of forming a semiconductor device having a function of sending and receiving electromagnetic waves, only a plurality of transistors or a plurality of transistors and a conductive layer serving as an antenna may be formed over the substrate 10. In addition, in the case of forming a semiconductor device having a function of storing data, a plurality of transistors and a memory element (for example, a transistor, a memory transistor, or the like) are preferably formed over the substrate 10. Further, in the case of forming a semiconductor device (for example, a CPU, a signal generation circuit, or the like) having a function of controlling a circuit or generating a signal or the like, a transistor is preferably formed over the substrate 10. In addition to the above-mentioned elements, another element such as a resistance element or a capacitor element may be formed if necessary.

The insulating layers 15 to 17 are formed with an inorganic material or an organic material by a plasma CVD method, a sputtering method, an SOG (Spin On Glass) method, a droplet discharge method, or the like. In the above-described structure, three-layered insulating layers (insulating layers 15 to 17) are formed over the plurality of transistors 14; however, the invention is not limited thereto. The number of insulating layers provided over the plurality of transistors 14 is not particularly limited.

The conductive layers 18 to 27 are formed by a plasma CVD method, a sputtering method, or the like with a single layer or a stacked layer of an element selected from titanium (Ti), aluminum (Al), neodymium (Nd), or the like or an alloy material or a compound material containing the above-described element as its main component.

Note that after forming the conductive layers 18 to 27, a layer for protecting the conductive layers 18 to 27 may be formed over the conductive layers 18 to 27 if needed and a surface of the substrate 10, which is not provided with the plurality of transistors 14, may be ground by a grinding apparatus. The grinding apparatus is, for example, a grind stone. Subsequently, the ground surface of the substrate 10, which is not provided with the plurality of transistors 14, may be polished by a polishing apparatus. The polishing apparatus is, for example, a polishing pad or an abrasive grain (for example, cerium oxide or the like). Note that either or both of a cleaning step for removing a dust and a drying step may be performed if needed, after the grinding step and the polishing step.

Figure 1B:
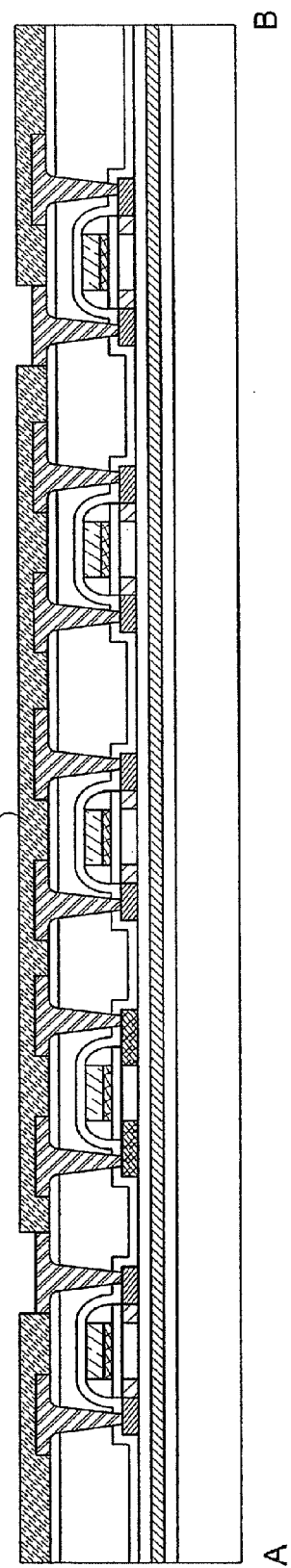
Figure 5C:
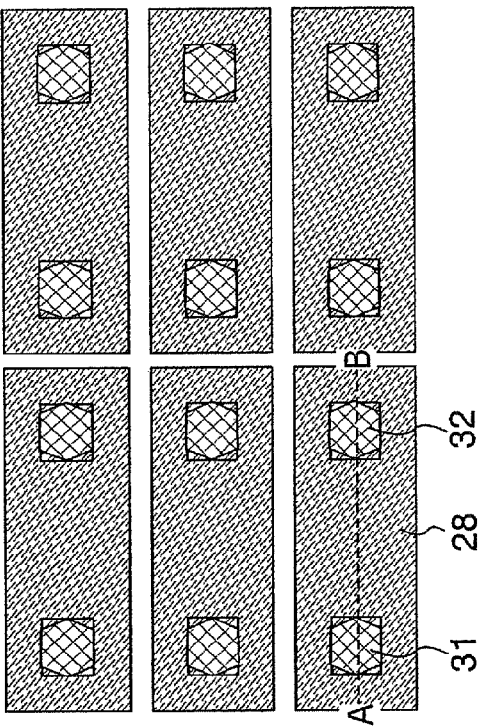
FIGS. 5A to 5C show a semiconductor device of the invention and a manufacturing method thereof.
Figure 5A:
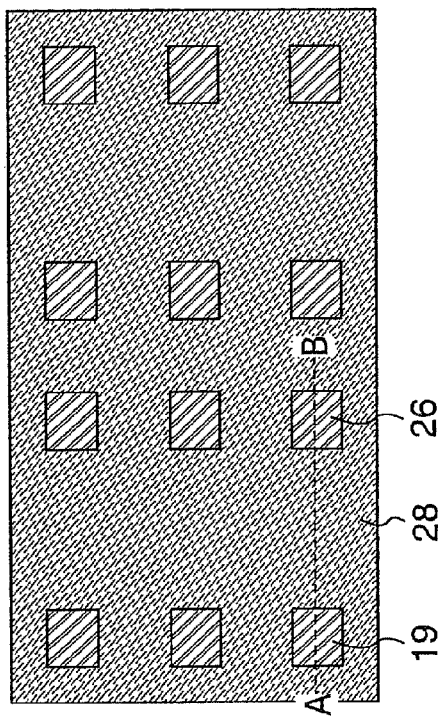

Next, a resin layer 28 is selectively formed over the insulating layer 17 and the conductive layers 18 to 27 (FIG. 1B and FIG. 5A). At this time, the resin layer 28 is selectively formed to expose the conductive layers 19 and 26. The resin layer 28 is selectively and uniformly formed by a screen printing method, a droplet discharge method (for example, an inkjet method), a photolithography method (for example, patterning using light exposure, dry etching, or wet etching), or the like. Among these methods, a screen printing method is preferably used. This is because the treatment time is short and the apparatus is cheap in the screen printing method. Although the conductive layers 19 and 26 do not overlap the resin layer 28 in the structure shown in the drawing, the conductive layers 19 and 26 may partially overlap the resin layer 28. The resin layer 28 is formed with an insulating resin to have a thickness of 5 to 200 μm, and preferably 15 to 35 μm. The insulating resin means, for example, epoxy resin, acrylic resin, polyimide resin, or the like. Further, a material having an attachment property may be used as the resin layer 28.

Figure 2A:
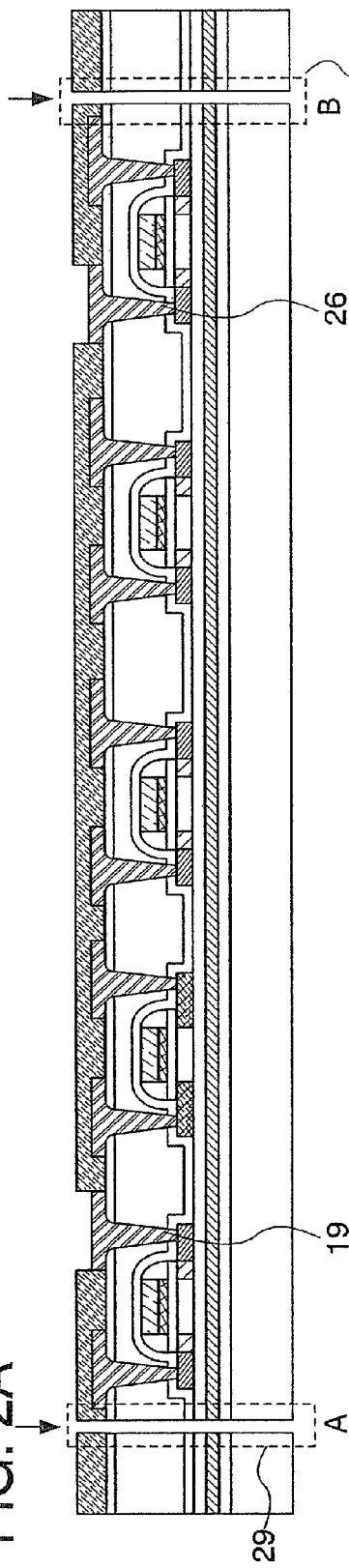
FIGS. 2A to 2C show a semiconductor device of the invention and a manufacturing method thereof.
Figure 5B:
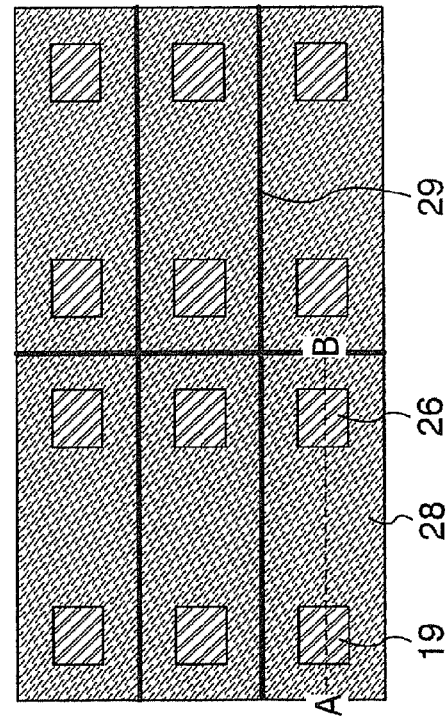

Then, opening portions 29 are formed so as to expose at least a part of the release layer 12 (FIG. 2A and FIG. 5B). This step is performed by a photolithography method, laser beam irradiation, or the like; however, the laser beam irradiation is preferably used because the treatment time is short. The substrate 10, the release layer 12, the insulating layers 11, 13, and 15 to 17, and the resin layer 28 are irradiated with a laser beam. The laser beam irradiation is performed toward a surface of the resin layer 28. The opening portions 29 are formed to expose at least a part of the release layer 12. Accordingly, the opening portions 29 are formed at least in the insulating layers 13 and 15 to 17 and the resin layer 28. A case where a laser beam reaches the substrate 10 is shown in the structure of the drawing. In addition, a case where the substrate 10 is divided into six portions is described.

A laser that emits the laser beam includes a laser medium, an excitation source, and a resonator. A laser can be classified by its medium into either a gas laser, a liquid laser, or a solid-state laser. In addition, the laser can be classified by its oscillation characteristics into either a free electron laser, a semiconductor laser, or an X-ray laser. In the invention, any laser may be used. Note that a gas laser or a solid-state laser is preferably used, and more preferably, a solid-state laser is used.

As examples of the gas laser, there are a helium-neon laser, a carbon dioxide gas laser, an excimer laser, and an argon ion laser. As the excimer laser, a rare gas excimer laser or a rare gas halide excimer laser can be used. Any of three types of excited molecules, which are argon, krypton, and xenon can be used for the rare gas excimer laser. As the argon ion laser, a rare gas ion laser or a metal vapor ion laser can be given.

As the liquid laser, there are an inorganic liquid laser, an organic chelate laser, and a dye laser. In the inorganic liquid laser and the organic chelate laser, a rare-earth ion of neodymium or the like which is utilized for a solid-state laser is used as a laser medium.

A laser medium used in a solid-state laser is formed by doping a solid-state parent substance with an active species. The solid-state parent substance is crystal or glass. The crystal refers to YAG (yttrium aluminum garnet crystal), YLF, $YVO_4$, $YAlO_3$, sapphire, ruby, or alexandrite. In addition, the active species is, for example, a trivalent ion ($Cr^{3+}$, $Nd^{3+}$, $Yb^{3+}$, $Tm^{3+}$, $Ho^{3+}$, $Er^{3+}$, or $Ti^{3+}$).

Note that a continuous wave laser or a pulsed laser can be used as the laser used in the invention. In addition, irradiation condition of a laser beam which is emitted from the above-described laser, such as frequency, power density, energy density, or beam profile is appropriately adjusted in consideration of the thickness of a stack including the plurality of transistors 14 or the like.

A step of irradiation with the above-described laser beam uses ablation processing. The ablation processing is a processing using a phenomenon, in which a molecular bond of a portion irradiated with a laser beam, that is a portion where the laser beam is absorbed, is broken, photodecomposed, and aerified. In other words, in the invention, the opening portions 29 are formed by irradiating a portion of the substrate 10, the release layer 12, the insulating layers 11, 13, and 15 to 17, and the resin layer 28 with a laser beam so as to break a molecular bond and to photodecompose and aerify the portion.

Solid-state laser having a wavelength of 1 to 380 nm (more preferably, 150 to 300 nm), which is an ultraviolet region, may be used as laser. Preferably, $Nd:YVO_4$ laser having a wavelength of 1 to 380 nm is used because it is more easily absorbed in a substrate compared with other laser beams having a longer wavelength and ablation processing is possible. Further, the periphery of the processing portion is not affected by the $Nd:YVO_4$ laser, which means good workability.

Figure 2B:
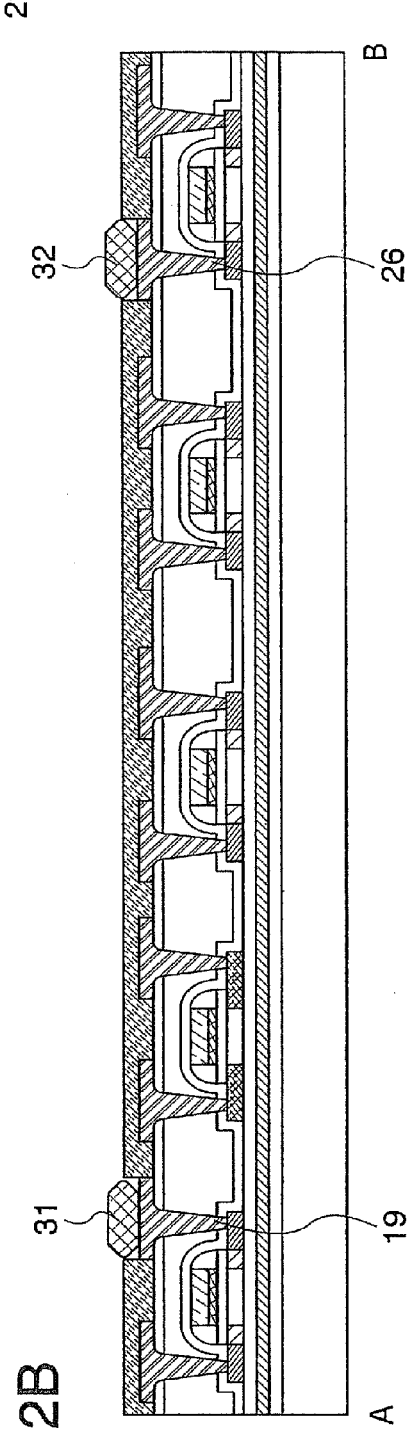

Subsequently, layers 31 and 32 containing conductive particles are selectively formed so as to be in contact with the conductive layers 19 and 26 (FIG. 2B and FIG. 5C). The layers 31 and 32 containing conductive particles are formed by a screen printing method, a droplet discharge method, a photolithography method, a dispensing method, or the like. Layers containing gold particles, silver particles, or the like are formed as the layers 31 and 32 containing conductive particles. It is preferable to form layers containing low-resistance silver particles. The layers 31 and 32 containing conductive particles are formed with the thickness so as to be connected to a conductive layer 40 below a substrate 36 to be formed later.

Figure 2C:
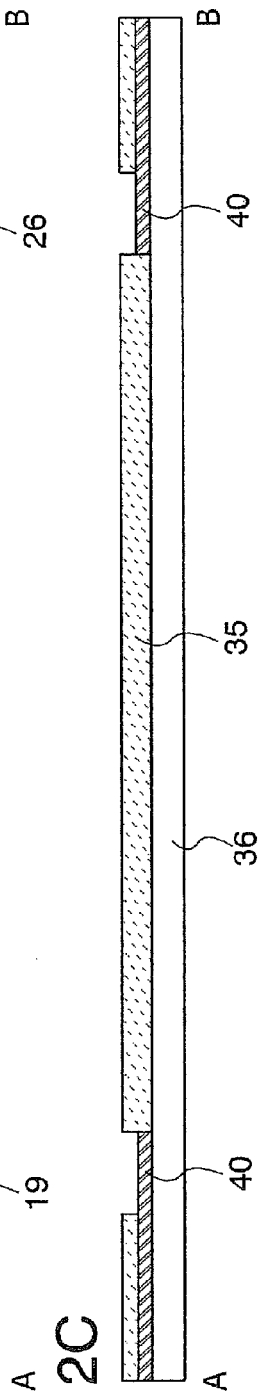
Figure 6A:
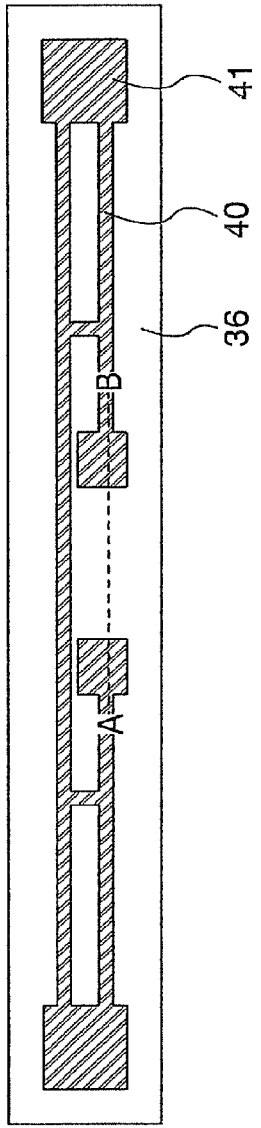
FIGS. 6A to 6C show a semiconductor device of the invention and a manufacturing method thereof.

Next, the substrate 36 provided with the conductive layer 40 for utilizing inductance (also referred to as an inductor) and a capacitor element 41 is prepared (FIG. 2C and FIG. 6A). Each of the conductive layer 40 and the capacitor element 41 is formed by a screen printing method, a droplet discharge method, a photolithography method, a sputtering method, a CVD method, or the like. Note that the conductive layer 40 and the capacitor element 41 are connected in parallel. By resonating the conductive layer 40 and the capacitor element 41, which are connected in parallel, with an operating frequency, required electric power can be obtained. Here, the conductive layer 40 and the capacitor element 41 are collectively called an antenna, and the conductive layers used for the conductive layer 40 and the capacitor element 41 are called conductive layers serving as an antenna.

Figure 6B:
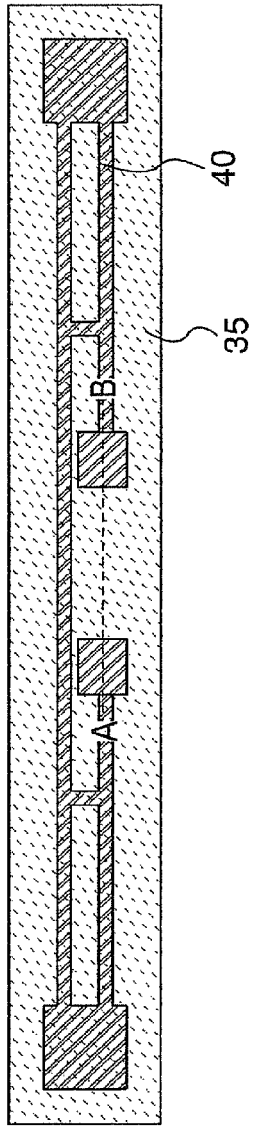

Then, a resin layer 35 for protecting each of the conductive layer 40 and the capacitor element 41 is selectively formed over the substrate 36 (FIG. 2C and FIG. 6B). Note that a protective layer may also be formed using a substrate, a liquid resist material, or the like instead of a resin layer. Further, a material having an attachment property may also be used as the resin layer 35.

Figure 6C:
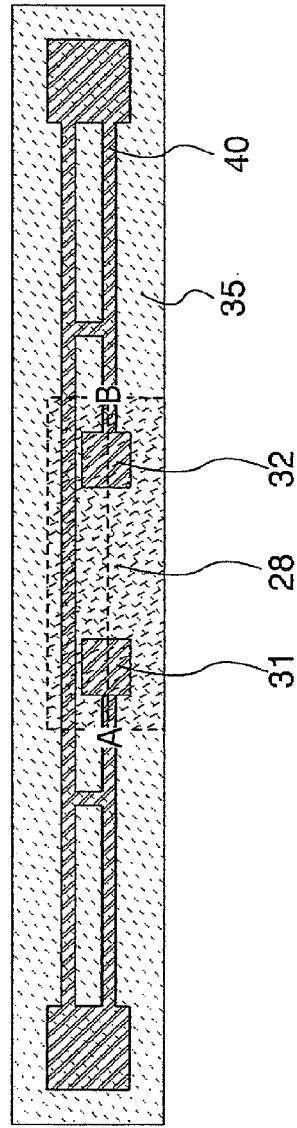

Subsequently, the conductive layer 40 is electrically connected to the conductive layers 19 and 26 with the layers 31 and 32 containing conductive particles interposed therebetween, and the substrate 36 is provided over the resin layer 28 (FIG. 3A). Then, the stack including the plurality of transistors 14 is separated from the substrate 10 by using the substrate 36 (FIG. 3B and FIG. 6C). The conductive layers 19 and 26 are electrically connected to the conductive layer 40 by either or both of pressure treatment and heat treatment with a flip chip bonder, a die bonder, an ACF (Anisotropic Conductive Film) bonder, a pressure bonder, or the like. When separation occurs inside the release layer 12 or at a boundary between the release layer 12 and the insulating layer 13, the stack including the plurality of transistors 14 is separated from the substrate 10 (FIG. 3B). The drawing shows the structure of the case where the stack including the plurality of transistors 14 is separated from the substrate 10 at the boundary between the release layer 12 and the insulating layer 13. When a material having an attachment property is used for the resin layer 28 or the resin layer 35, the attachment property between the substrate 36 and the stack including the plurality of transistors 14 is increased. Accordingly, a step of separating the stack including the plurality of transistors 14 from the substrate 10 can be performed easily.

In this embodiment mode, the layers 31 and 32 containing conductive particles are electrically connected to the conductive layers 19 and 26 serving as a source wire or a drain wire of a transistor, and then, the substrate 36 provided with the conductive layer 40 and the capacitor element 41 is provided over the resin layer 28 so as to electrically connect the conductive layers 19 and 26 to the conductive layer 40. However, the invention is not limited to this structure. The layers 31 and 32 containing conductive particles may be formed over the conductive layer 40 which is formed over the substrate 36, and then, the substrate 36 may be provided over the resin layer 28 so as to electrically connect the conductive layers 19 and 26 to the conductive layer 40. Alternatively, the layers containing conductive particles may be provided over both the conductive layers 19 and 26 and the conductive layer 40.

Figure 4:
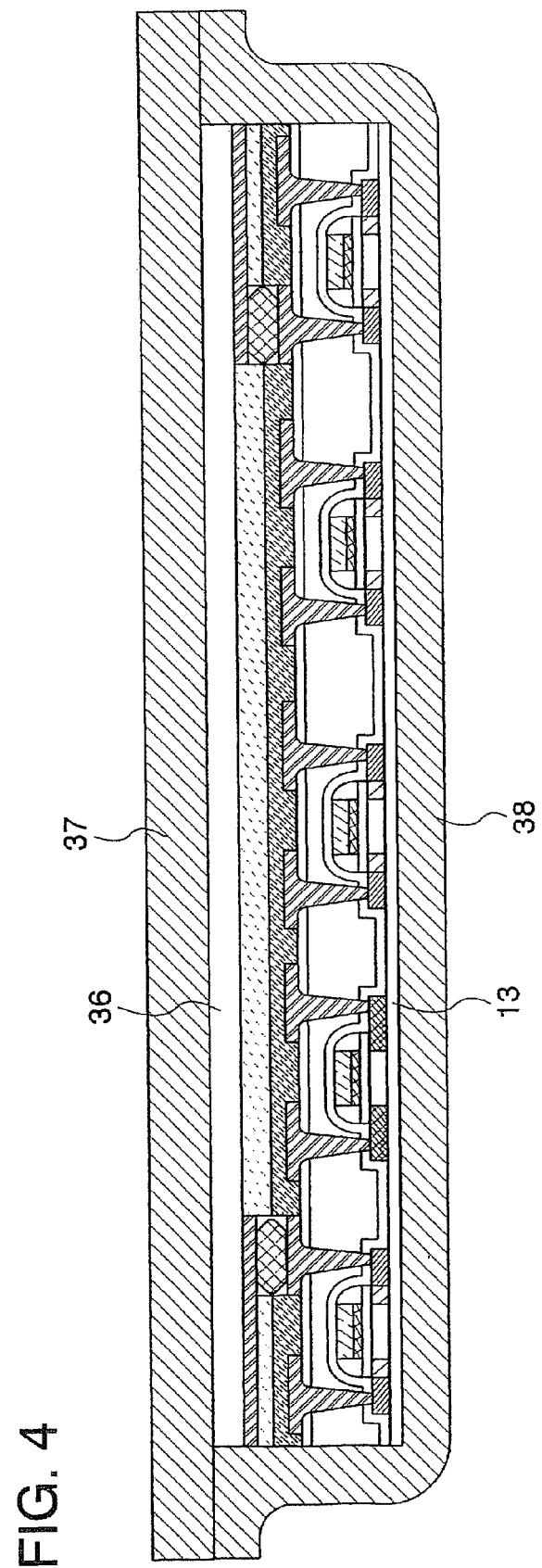
FIG. 4 shows a semiconductor device of the invention and a manufacturing method thereof.

Next, the stack including the plurality of transistors 14 is sealed by a substrate if necessary (FIG. 4). Specifically, either or both of surfaces of the substrate 36 and the insulating layer 13 are newly provided with a substrate. In the structure shown in the drawing, the surface of the substrate 36 is provided with a substrate 37 and a surface of the insulating layer 13 is provided with a substrate 38 so as to seal the stack including the plurality of transistors 14 with the substrates 37 and 38.

Each of the substrates 37 and 38 (also referred to as a base, a film, or a tape) is a flexible substrate. As each base material of the substrates 37 and 38, a material such as polyethylene, polypropylene, polystyrene, AS resin (resin in which acrylonitrile and styrene are polymerized), ABS resin (resin in which acrylonitrile, butadiene, and styrene are polymerized), methacryl resin (also referred to as acrylic), polyvinyl chloride, polyacetal, polyamide, polycarbonate, modified polyphenylene ether, polybutylene terephthalate, polyethylene terephthalate, polysulfone, polyethersulfone, polyphenylene sulfide, polyamide-imide, polymethylpentene, phenol resin, urea resin, melamine resin, epoxy resin, diallyl phthalate resin, unsaturated polyester resin, polyimide, or polyurethane, or a fibrous material (for example, paper) can be used. A single film or a film in which a plurality of films is stacked may be used as the film. In addition, an attachment layer may be provided on the surface. The attachment layer is a layer containing an adhesive agent such as thermosetting resin, ultraviolet curable resin, polyvinyl acetate resin-based adhesive, vinyl copolymer resin-based adhesive, epoxy resin-based adhesive, urethane resin-based adhesive, rubber-based adhesive, or acrylic resin-based adhesive.

Surfaces of substrates 37 and 38 may be coated with powder of silicon dioxide (silica). By the coating, even when the substrates 37 and 38 are in an atmosphere with a high temperature and a high humidity, a waterproof property can be secured. In addition, the surfaces may be coated with a conductive material such as indium tin oxide. The material, with which the surfaces are coated, charges static electricity and a thin film integrated circuit can be protected from the static electricity. In addition, the surfaces may be coated with a material containing carbon as its main component (for example, diamond like carbon). By the coating, strength is improved, and deterioration and break of a semiconductor device can be suppressed. In addition, the substrates 37 and 38 may be formed with a material in which the above-described base material (for example, resin) and silicon dioxide, a conductive material, or a material containing carbon as its main component are mixed.

The stack including the plurality of transistors 14 is sealed by the substrates 37 and 38 by melting surface layers of substrates 37 and 38 or attachment layers on the surfaces of the substrates 37 and 38 by heat treatment. Further, pressure treatment is conducted for attachment, if necessary.

Embodiment Mode 2

In the manufacturing method of the semiconductor device of the invention, the order of the manufacturing steps may be changed. An example of the case where the order of the manufacturing steps is changed will be described with reference to FIGS. 1A and 1B, FIGS. 3A and 3B, FIG. 4, and FIGS. 7A to 7C.

First, an insulating layer 11 is formed over a substrate 10, a release layer 12 is formed over the insulating layer 11, and an insulating layer 13 is formed over the release layer 12 (FIG. 1A). Then, a plurality of transistors 14 is formed over the insulating layer 13, and insulating layers 15 to 17 are formed over the plurality of transistors 14. Subsequently, opening portions are formed in the insulating layers 15 to 17, and conductive layers 18 to 27 are formed so as to be each connected to source region or the drain region of the plurality of transistors 14. Then, a resin layer 28 is selectively formed over the insulating layer 17 and the conductive layers 18 to 27 (FIG. 1B). At this time, the resin layer 28 is formed to expose the conductive layers 19 and 26.

Next, a resin layer 35 is selectively formed over the resin layer 28 (FIG. 7A). At this time, the resin layer 35 is formed to expose the conductive layers 19 and 26. The resin layer 35 is selectively and uniformly formed by a screen printing method, a droplet discharge method, or the like. Among these methods, the screen printing method is preferably used because the treatment time is short and the apparatus is cheap in the screen printing method. An anisotropic conductive paste or an insulating resin having a thickness of 5 to 150 Mm, and preferably 30 to 50 µm is formed as the resin layer 35.

Then, opening portions 29 are formed to expose at least the release layer 12 (FIG. 7B). Further, layers 31 and 32 containing conductive particles are formed over the conductive layers 19 and 26 (FIG. 7C).

Next, a substrate 36 provided with a conductive layer 40 and a capacitor element 41 is prepared. Subsequently, the conductive layers 19 and 26 are electrically connected to the conductive layer 40 with the layers 31 and 32 containing conductive particles interposed therebetween, and the substrate 36 is provided over the resin layer 35 (FIG. 3A). Then, the stack including the plurality of transistors 14 is separated from the substrate 10 by using the substrate 36 (FIG. 3B). In addition, the stack including the plurality of transistors 14 is sealed by a substrate if necessary (FIG. 4). Specifically, either or both of surfaces of the substrate 36 and the insulating layer 13 are newly provided with a substrate. This embodiment mode can be freely combined with other embodiment modes or embodiments.

Embodiment Mode 3

A manufacturing method of a semiconductor device of the invention will be described with reference to FIGS. 1A and 1B and FIG. 8A to FIG. 10B.

First, an insulating layer 11 is formed over a substrate 10, a release layer 12 is formed over the insulating layer 11, and an insulating layer 13 is formed over the release layer 12 (FIG. 1A). Then, a plurality of transistors 14 is formed over the insulating layer 13, and insulating layers 15 to 17 are formed over the plurality of transistors 14. Subsequently, opening portions are formed in the insulating layers 15 to 17 to form conductive layers 18 to 27 which are each connected to a source region or a drain region of the plurality of transistors 14.

Figure 8A:
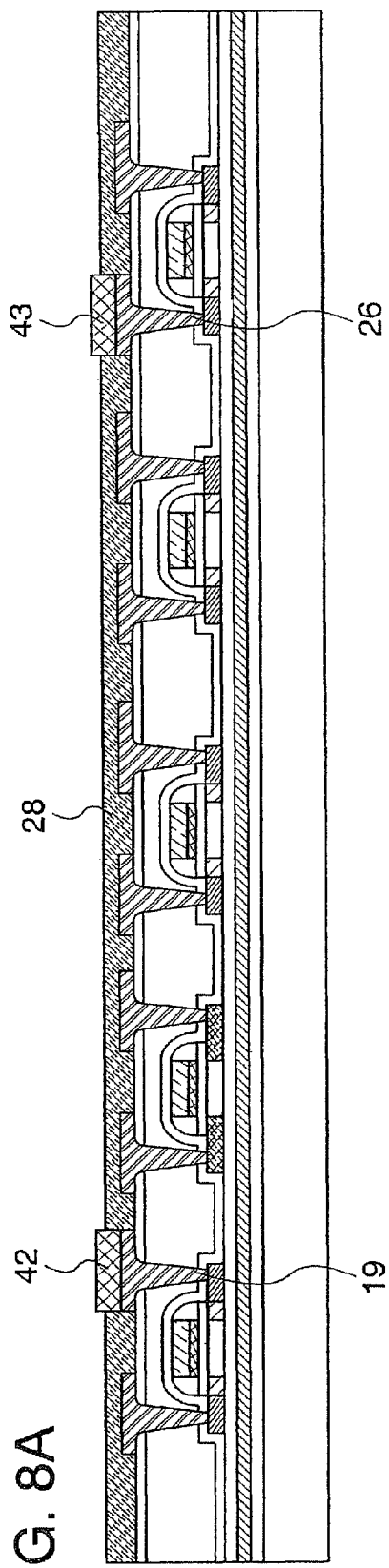
FIGS. 8A and 8B show a semiconductor device of the invention and a manufacturing method thereof.

Next, a resin layer 28 is selectively formed over the insulating layer 17 and the conductive layers 18 to 27 (FIG. 8A). Then, layers 42 and 43 containing conductive particles are selectively formed so as to be in contact with the conductive layers 19 and 26. The layers 42 and 43 containing conductive particles are selectively and uniformly formed by a screen printing method, a drop discharge method, a photolithography method, a dispensing method, or the like. Among these methods, a screen printing method is preferably used because the treatment time is short and the apparatus is cheap. The layers 42 and 43 containing conductive particles are formed to have a thickness of 6 to 200 μm, and preferably 40 to 70 μm. The layers 42 and 43 containing conductive particles are preferably formed such that surfaces of the layers 42 and 43 containing conductive particles are in a higher position than that of a surface of the resin layer 28. The layers 42 and 43 containing conductive particles are formed with a resin containing a conductive material, for example, a resin containing silver, gold, or solder. A resin containing low-resistance silver is preferably used.

Figure 8B:
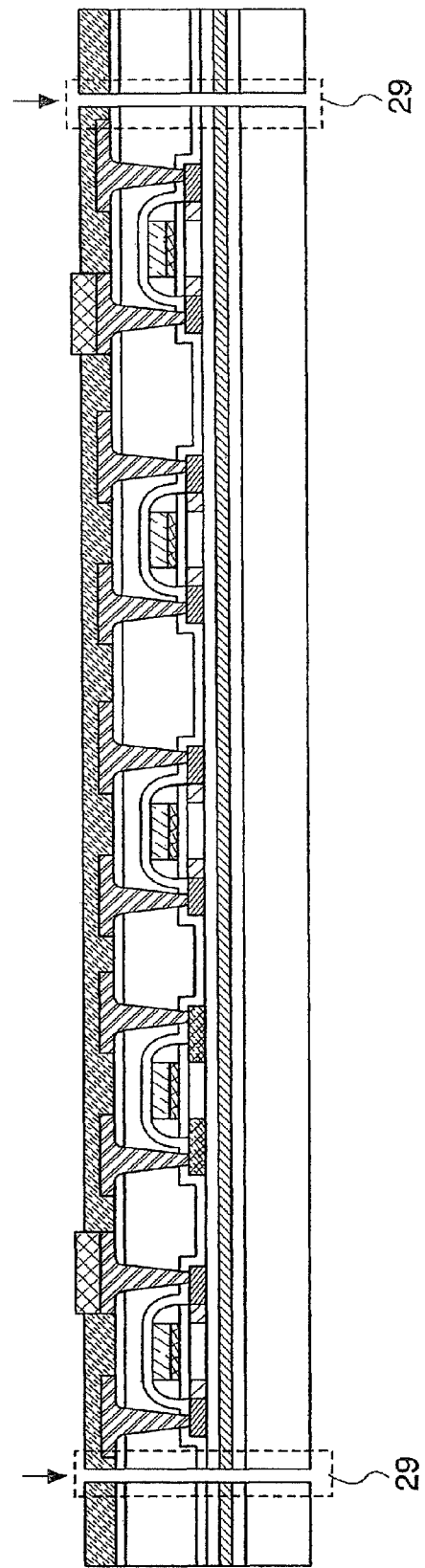

Then, opening portions 29 are formed to expose at least a part of the release layer 12 (FIG. 8B).

Next, a substrate 36 provided with a conductive layer 40 is prepared (FIG. 9A). Then, layers 45 and 46 containing conductive particles are formed to be in contact with the conductive layer 40. Subsequently, a resin layer 44 is formed to cover the conductive layer 40, the substrate 36, and the layers 45 and 46 containing conductive particles. The layers 45 and 46 containing conductive particles are not necessarily provided as long as the conductive layer 40 can be electrically connected to the layers 42 and 43 containing conductive particles only by using the resin layer 44.

The layers 45 and 46 containing conductive particles are selectively and uniformly formed by a screen printing method or the like, similarly to the case of the layers 42 and 43 containing conductive particles. The layers 45 and 46 containing conductive particles are formed with a thickness of 5 to 200 μm, and preferably 40 to 80 μm.

The resin layer 44 is selectively and uniformly formed by a screen printing method, a droplet discharge method, or the like. Among these methods, a screen printing method is preferably used. The resin layer 44 is formed with a thickness of 5 to 150 μm, and preferably 30 to 50 μm with an anisotropic conductive material or an insulating resin material. The anisotropic conductive material is a material containing conductive particles.

Next, the substrate 36 is provided over the resin layer 28 so that the conductive layers 19 and 26 are electrically connected to the conductive layer 40 with the layers 42 and 43 containing conductive particles, the resin layer 44, and the layers 45 and 46 containing conductive particles interposed therebetween (FIG. 9B). The drawing shows the structure of the case where the resin layer 44 is an anisotropic conductive layer. Accordingly, the resin layer 44 is provided between the layers 42 and 43 containing conductive particles and the layers 45 and 46 containing conductive particles. If the resin layer 44 is a layer containing an insulating resin, the resin layer 44 is not provided between the layers 42 and 43 containing conductive particles and the layers 45 and 46 containing conductive particles.

Subsequently, the stack including the plurality of transistors 14 is separated from the substrate 10 by using the substrate 36 (FIG. 10A).

Then, the stack including the plurality of transistors 14 is sealed by a substrate if necessary (FIG. 10B). Specifically, either or both of surfaces of the substrate 36 and the insulating layer 13 are newly provided with a substrate. In the structure shown in the drawing, the stack including the plurality of transistors 14 is sealed by substrates 37 and 38, by providing the substrate 37 over the surface of the substrate 36 and providing the substrate 38 over the surface of the insulating layer 13. This embodiment mode can be freely combined with other embodiment modes or embodiments.

Embodiment 1

A substrate provided with a conductive layer serving as an antenna will be described with reference to FIGS. 11A and 11B. Two examples of the substrate provided with a conductive layer are described below.

As an example thereof, a conductive layer 62 is provided over a substrate 61. The substrate 61 is formed with polyimide, PET (polyethylene terephthalate), PEN (polyethylene naphthalate), PC (polycarbonate), PES (polyethersulfone), or the like. The conductive layer 62 is formed with copper, silver, or the like. In addition, an exposed portion of the conductive layer 62 is plated with gold or the like for protection against oxidation.

As another example, the conductive layer 62 and a protection layer 63 are provided over the substrate 61. The protection layer 63 can be formed with a single layer or a stacked layer formed by using the same material of a substrate or an insulating resin The substrate is formed with polyimide, PET (polyethylene terephthalate), PEN (polyethylene naphthalate), PC (polycarbonate), or PES (polyethersulfone). The insulating resin corresponds to a liquid resist, epoxy resin, silicon resin, or synthetic rubber resin. This embodiment can be freely combined with other embodiment modes or embodiments.

Embodiment 2

Figure 12:
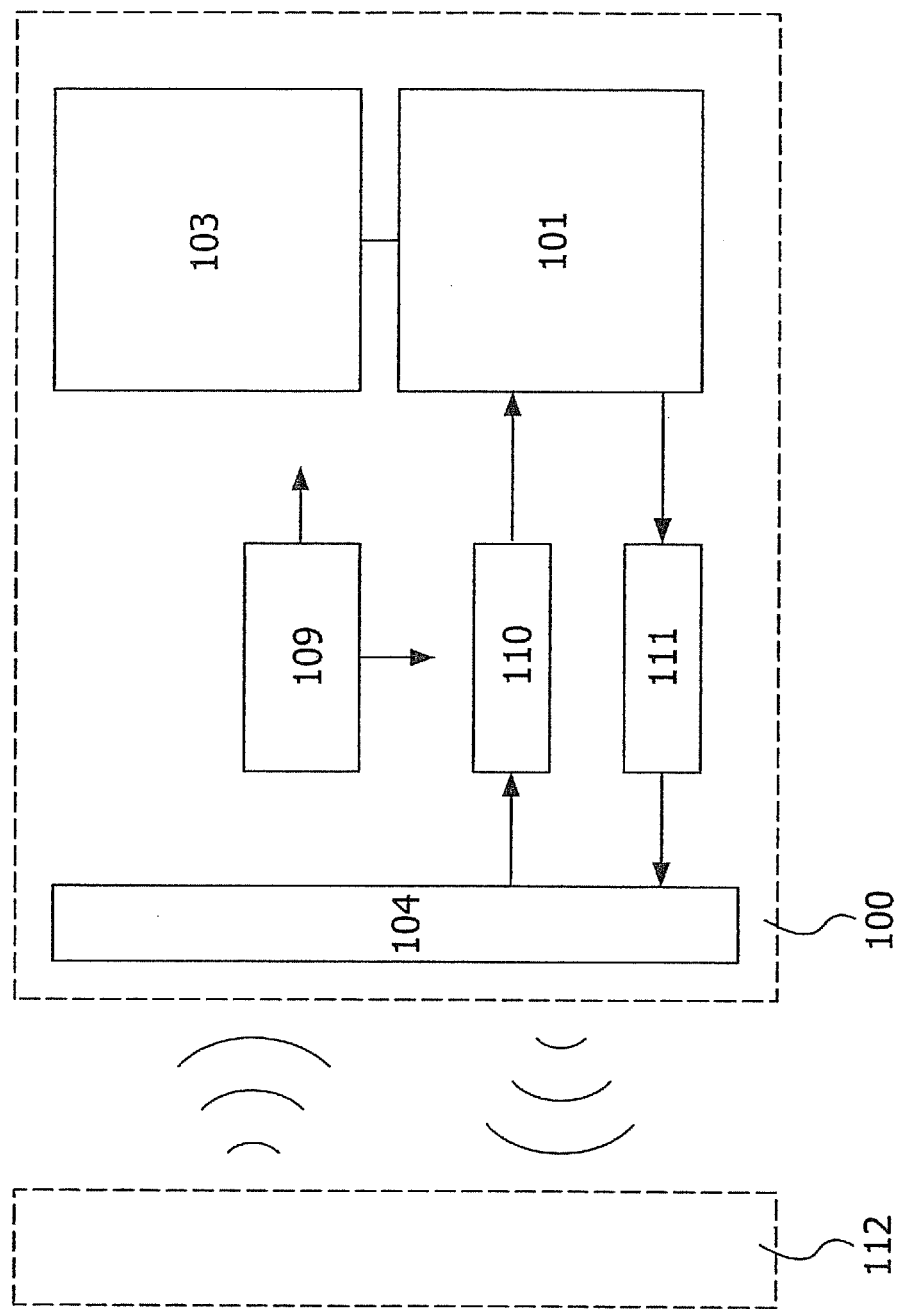
FIG. 12 shows a semiconductor device of the invention.

A structure of a semiconductor device of the invention will be described with reference to FIG. 12. A semiconductor device 100 of the invention includes an arithmetic processing circuit 101, a memory circuit 103, an antenna 104, a power supply circuit 109, a demodulation circuit 110, and a modulation circuit 111. The semiconductor device 100 necessarily includes the antenna 104 and the power supply circuit 109. Other elements are provided as appropriate in accordance with the usage of the semiconductor device 100.

The arithmetic processing circuit 101 analyzes command, controls the memory circuit 103, outputs data to be transmitted to the outside into the modulation circuit 111, or the like, based on a signal input from the demodulation circuit 110.

The memory circuit 103 includes a circuit including a memory element, and a control circuit for controlling writing and reading of data. In the memory circuit 103, at least an identification number for the semiconductor device itself is stored. The identification number is used for distinguishing the semiconductor device from other semiconductor devices. In addition, the memory circuit 103 includes one kind or a plurality of kinds of memory, selected from among an organic memory, a DRAM (Dynamic Random Access Memory), an SRAM (Static Random Access Memory), a FeRAM (Ferroelectric Random Access Memory), a mask ROM (Read Only Memory), a PROM (Programmable Read Only Memory), an EPROM (Electrically Programmable Read Only Memory), an EEPROM (Electrically Erasable Programmable Read Only Memory), or a flash memory. The organic memory has a structure in which a layer containing an organic compound is interposed between a pair of conductive layers. Since the organic memory has a simple structure, manufacturing process can be simplified and cost can be reduced. In addition, due to the simple structure, an area of a stack can be reduced and large capacity can be easily realized. Further, it is also an advantage that the organic memory is nonvolatile and does not require incorporation of a battery. Accordingly, it is preferable that the organic memory be used as the memory circuit 103.

The antenna 104 converts a carrier wave provided from a reader/writer 112 into an alternating electrical signal. In addition, load modulation is applied from the modulation circuit 111. The power supply circuit 109 generates power voltage by using the alternating electrical signal converted by the antenna 104 and supplies power voltage to each circuit.

The demodulation circuit 110 demodulates the alternating electrical signal converted by the antenna 104 and supplies the demodulated signal to the arithmetic processing circuit 101. The modulation circuit 111 applies load modulation to the antenna 104, based on the signal supplied from the arithmetic processing circuit 101.

The reader/writer 112 receives the load modulation applied to the antenna 104 as a carrier wave. In addition, the reader/writer 112 transmits the carrier wave to the semiconductor device 100. Note that the carrier wave refers to an electromagnetic wave which is generated in the reader/writer 112. This embodiment can be freely combined with other embodiment modes and embodiments.

Embodiment 3

The semiconductor device of the invention can be used in various articles and various systems by utilizing the function of transmitting and receiving an electromagnetic wave. As examples of articles, keys (FIG. 13A), paper money, coins, securities, bearer bonds, certificates (a license, resident's card, or the like), books, packing containers (a petri dish or the like, FIG. 13B), personal accessories and ornaments (bags, glasses, or the like, FIG. 13C), packing and wrapping containers (wrapping paper, bottles, or the like, FIG. 13D), recording media (a disk, a video tape, or the like), vehicles (a bicycle or the like), foods, clothing, everyday articles, electronic device (a liquid crystal display device, an EL display device, a television device, a portable terminal, or the like), or the like can be given. Note that semiconductor devices 1301 of the invention are fixed by being attached to surfaces of the articles having various forms as described above, or being embedded into the articles.

Figure 13E:
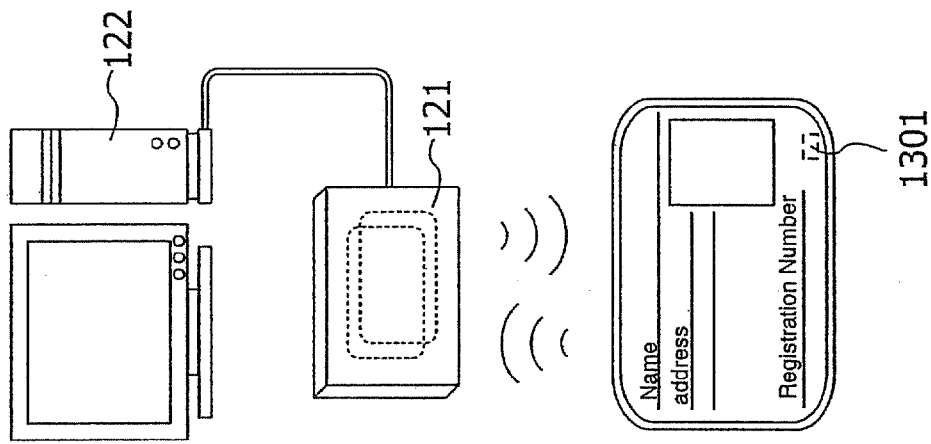
FIGS. 13A to 13E show semiconductor devices of the invention.
Figure 13C:
Figure 13D:
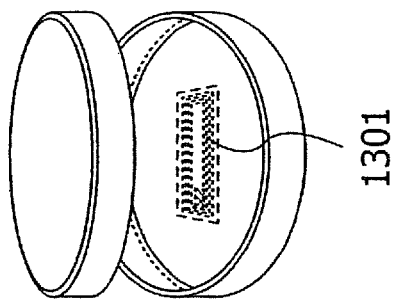
Figure 13A:
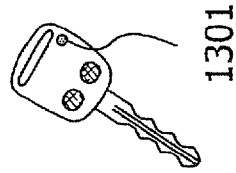
Figure 13B:
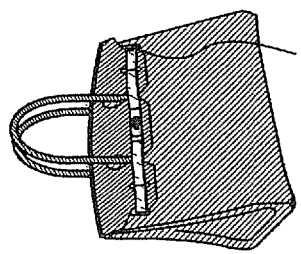

In addition, a system refers to a physical-distribution inventory system, an authentication system, a distribution system, a production record system, a book management system, or the like. By using the semiconductor device of the invention, sophistication, multifunctionality, and high added value of the system can be achieved. For example, the semiconductor device of the invention is provided inside an identification card, and a reader/writer 121 is provided at an entrance of a building or the like (FIG. 13E). The reader/writer 121 reads an identification number which is inside the identification card that every person possesses and supplies information about the identification number that has been read to a computer 122. The computer 122 determines whether to authorize the person's entrance or exit, based on the information provided from the reader/writer 121. In this way, by using the semiconductor device of the invention, security is ensured and an entrance-exit management system in which sophistication and high added value is achieved can be provided. This embodiment can be freely combined with other embodiment modes or embodiments.

Embodiment 4

In Embodiment 4, a manufacturing method of a transistor will be described with reference to FIGS. 14A to 16B.

Figure 14A:
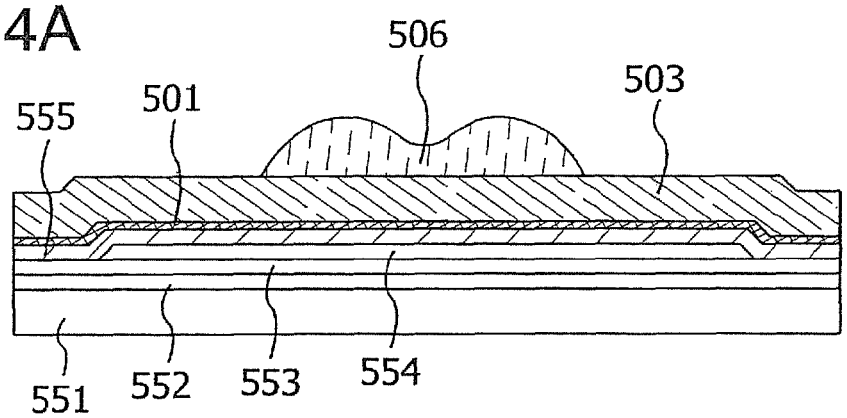
FIGS. 14A to 14D show a manufacturing method of a transistor.

An insulating layer 552 is formed over a substrate 551 (FIG. 14A). Next, an insulating layer 553 is formed over the insulating layer 552. Then, a semiconductor layer 554 is formed over the insulating layer 553. In addition, a gate insulating layer 555 is formed over the semiconductor layer 554.

The semiconductor layer 554 is formed through the manufacturing process described below, for example. First, an amorphous semiconductor layer is formed by a sputtering method, an LPCVD method, a plasma CVD method, or the like. Subsequently, the amorphous semiconductor layer is crystallized by a laser crystallization method, an RTA (Rapid Thermal Anneal) method, a thermal crystallization method using an annealing furnace, a thermal crystallization method using a metal element promoting crystallization, a method in which the thermal crystallization method using a metal element promoting crystallization and the laser crystallization method are combined, or the like to form a crystalline semiconductor layer. Then, the crystalline semiconductor layer obtained is patterned to form a desired shape.

The semiconductor layer 554 is preferably formed by a combination of a crystallization method including thermal treatment and a crystallization method in which irradiation of a continuous wave laser beam or a laser beam oscillating with a frequency of 10 MHz or more is conducted. By irradiating the semiconductor layer 554 with a continuous wave laser beam or a laser beam oscillating with a frequency of 10 MHz or more, a surface of the crystallized semiconductor layer 554 can be planarized. In addition, by planarizing the surface of the semiconductor layer 554, the gate insulating layer 555 can be thinned. Further, the pressure-resistance of the gate insulating layer 555 can be increased.

In addition, the gate insulating layer 555 may be formed by performing plasma treatment to the semiconductor layer 554, in which oxidation or nitridation of the surface of the semiconductor layer 554 is performed. For example, plasma treatment is employed, in which a mixed gas containing a rare gas such as He, Ar, Kr, or Xe and oxygen, oxidized nitrogen, ammonia, nitrogen, hydrogen, or the like is introduced. In this case, when excitation of plasma is performed by introducing a microwave, plasma with a high density and a low electron temperature can be generated. The surface of the semiconductor layer 554 can be oxidized or nitrided by oxygen radicals (OH radicals may be included) or nitrogen radicals (NH radicals may be included) generated with this high density plasma. In other words, an insulating layer with a thickness of 1 to 20 nm, typically 5 to 10 nm is formed in the semiconductor layer 554 by such a treatment using a high density plasma. Since the reaction in this case is a solid-phase reaction, an interface state density between the insulating layer and the semiconductor layer 554 can be extremely low. In such a high density plasma treatment, since a semiconductor layer (crystalline silicon or polycrystalline silicon) is directly oxidized (or nitrided), variation in the thickness of a gate insulating layer to be formed can be made extremely small. In addition, a semiconductor layer in a crystal grain boundary of crystalline silicon is not oxidized too much, which results in a very desirable state. In other words, in the high density plasma treatment described herein, by solid-phase oxidizing the surface of the semiconductor layer 554, a gate insulating layer 555 which has good uniformity and low interface state density can be formed, without excessive oxidation in a crystal grain boundary.

As for the gate insulating layer 555, just the insulating layer formed by high density plasma treatment may be used, or an insulating layer of silicon oxide, silicon oxynitride, silicon nitride, or the like may be stacked over the insulating layer by a CVD method using plasma or thermal reaction. In either case, characteristic variation can be reduced in a transistor including an insulating film formed by using high density plasma as the gate insulating layer 555 or as a part of the gate insulating layer 555.

Further, the semiconductor layer 554 which is crystallized by being scanned into one direction with a continuous wave laser beam or a laser beam oscillating with a frequency of 10 MHz or more, has a characteristic in which crystals are grown into a scanning direction of the beam. A transistor in which characteristic variation is reduced and field effect mobility is high can be obtained by setting the transistor so as to make the scanning direction the same as a channel length direction (a direction in which carriers are flown when a channel forming region is formed) and employing the above-described method to form a gate insulating layer.

Note that the insulating layers 552 and 553, the semiconductor layer 554, the gate insulating layer 555, or the like are formed by plasma treatment in some cases. Such a plasma treatment is preferably conducted with an electron density of $1\times10^{11}$ cm$^{-3}$ or more and an electron temperature of plasma of 1.5 eV or less. In more detail, the plasma treatment is preferably conducted with an electron density of $1\times10^{11}$ cm$^{-3}$ or more and $1\times10^{13}$ cm$^{-3}$ or less and an electron temperature of plasma of 0.5 eV or more and 1.5 eV or less.

When plasma has a high electron density and a low electron temperature in the vicinity of an object to be processed (for example, the insulating layers 552 and 553, the semiconductor layer 554, the gate insulating layer 555, or the like), the object to be processed can be prevented from being damaged from the plasma. In addition, since an electron density of plasma is as high as or more than $1\times10^{11}$ cm$^{-3}$, oxide or nitride formed by oxidizing or nitriding an object to be irradiated using plasma treatment is superior in uniformity of film thickness or the like and can be a denser film, compared with a thin film formed by a CVD method, a sputtering method, or the like. In addition, since the electron temperature of the plasma is as low as or less than 1.5 eV, oxidizing treatment or nitriding treatment can be conducted with a lower temperature, compared with conventional plasma treatment or a thermal oxidation method. For example, even when plasma treatment is performed at a temperature 100° C. or more lower than a strain point of a glass substrate, oxidizing treatment or nitriding treatment can be performed sufficiently.

Next, a conductive layer 501 and a conductive layer 503 are stacked over the gate insulating layer 555. Each of the conductive layers 501 and 503 is formed with a metal such as tungsten, chromium, tantalum, tantalum nitride, or molybdenum, or an alloy or a compound containing the metal as its main component. Note that the conductive layer 501 and the conductive layer 503 are formed with different materials from each other. Specifically, the conductive layers 501 and 503 are formed with different materials which cause a difference in an etching rate in an etching step to be performed later.

Then, a mask 506 made of a resist is formed over the conductive layer 503. The mask 506 is formed by using an exposure mask including a shielding film and a translucent film. A specific structure of this mask will be described later.

Figure 14B:
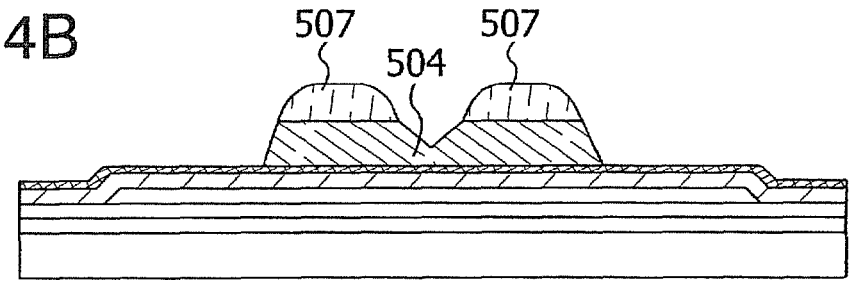
Figure 14C:
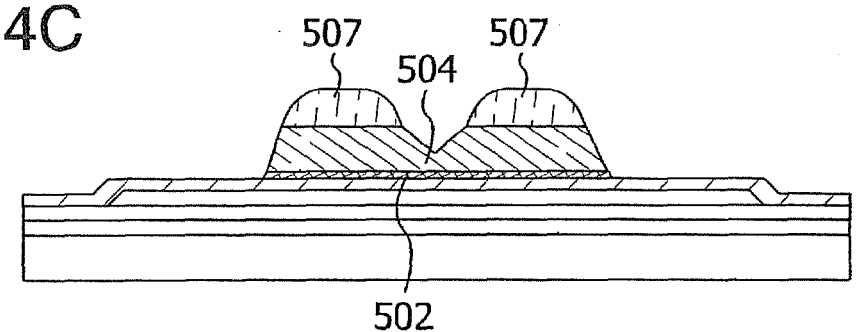

Subsequently, the conductive layer 503 is etched by using the mask 506 to form a mask 507 and a conductive layer 504 (FIG. 14B). The mask 507 is sputtered by ions accelerated by an electric field. Then, the mask 507 is divided into two patterns and two portions of the mask 507 are separately arranged. In addition, the conductive layer 501 is etched by using the mask 507 and the conductive layer 504 to form a conductive layer 502 (FIG. 14C).

Figure 14D:
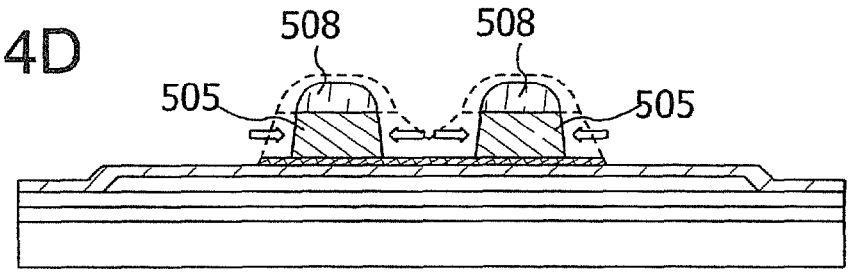

Next, the masks 507 and the conductive layer 504 are selectively etched to form masks 508 and a conductive layer 505 (FIG. 14D). The masks 508 are reduced in size, by being sputtered by ions accelerated by an electric field. In this step, attention needs to be paid so as not to etch the conductive layer 502, by adjusting bias voltage which is applied into a substrate side.

Figure 15A:
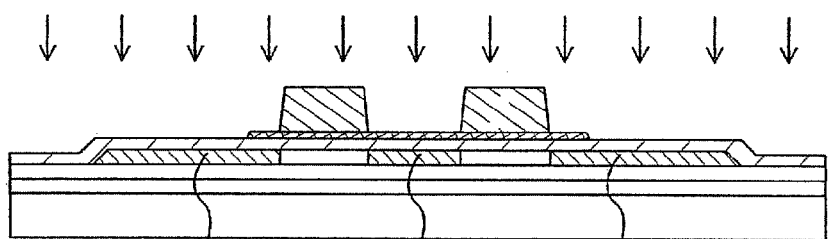
FIGS. 15A to 15C show a manufacturing method of a transistor.

Then, the semiconductor layer 554 is doped with an impurity element imparting one conductivity type to form impurity regions 509, 516, and 517 having a first concentration (FIG. 15A). At this time, the semiconductor layer 554 is doped with an impurity element in a self-aligning manner by using the conductive layer 505.

Figure 15B:
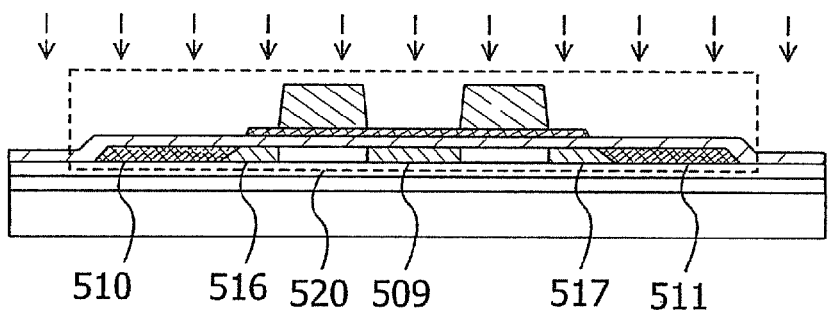

Next, the semiconductor layer 554 is doped with an impurity element imparting one conductivity type to form impurity regions 510 and 511 having a second concentration (FIG. 15B). Note that a portion of the semiconductor layer 554 which overlaps the conductive layer 505 is not doped with an impurity element imparting one conductivity. Accordingly, the portion of the semiconductor layer 554 which overlaps the conductive layer 505 functions as a channel forming region. Through the above-described process, a thin film transistor 520 is completed.

Figure 15C:
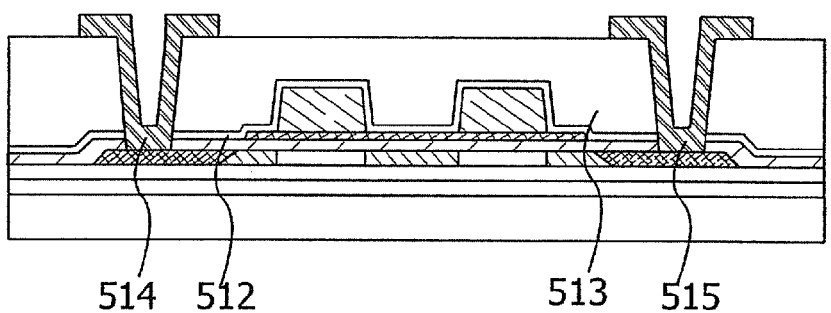

Subsequently, insulating layers 512 and 513 are formed to cover the thin film transistor 520 (FIG. 15C). Then, conductive layers 514 and 515 connected to the impurity regions 510 and 511 having a second concentration are formed through opening portions provided in the insulating layers 512 and 513.

One feature of the above-described step is to etch the conductive layers 501 and 503 by using the mask 506 having a complicated shape in which the thickness varies. By using the mask 506, the masks 507 can be formed separately from each other. Then, the distance between two channel forming regions can be reduced. Specifically, the distance between the two channel forming regions can be less than 2 µm. Accordingly, in the case of forming a multigate thin film transistor including two or more gate electrodes, the space for the transistor can be reduced. Therefore, a sophisticated semiconductor device in which high integration is achieved can be provided.

Next, a method for forming the mask 506 is described with reference to FIGS. 16A and 16B. FIG. 16A is an enlarged top view of a part of an exposure mask. FIG. 16B shows a section of the part of the exposure mask corresponding to FIG. 16A and a section of the stack including the substrate 551.

The exposure mask includes a light-transmitting substrate 560, shielding films 561 and 562, and a translucent film 563. The shielding films 561 and 562 each include a metal film of chromium, tantalum, $CrN_x$ (x is a positive integer), or the like. The material of the translucent film 563 is appropriately selected correspondingly to the exposure wavelength. For example, $TaSi_xO_y$ (x and y are positive integers), $CrO_xN_y$ (x and y are positive integers), $CrF_xO_y$ (x and y are positive integers), $MoSi_xN_y$ (x and y are positive integers), or $MoSi_xO_y$ (x and y are positive integers) may be used. The translucent film 563 functions as an auxiliary pattern.

The exposure of a resist mask with the use of the exposure mask having the above-described structure broadly divides the resist mask into a region 521 which is not exposed to light and a region 522 which is exposed to light. When development process is conducted in this state, the resist in the region 522 which is exposed to light is removed, and the mask 506 having the shape as shown in FIG. 14A is formed. This embodiment can be freely combined with other embodiment modes or embodiments.

This application is based on Japanese Patent Application serial no. 2005-158423 filed in Japan Patent Office on May 31, 2005, the entire contents of which are hereby incorporated by reference.

What is claimed is:

1. A semiconductor device comprising:
a transistor including a source region and a drain region;
an insulating layer over the transistor;
a first conductive layer directly connected to one of the source region and the drain region through a first opening portion in the insulating layer;
a second conductive layer directly connected to the other of the source region and the drain region through a second opening portion in the insulating layer;
a first resin layer over the insulating layer;
a layer comprising a conductive particle directly connected to the first conductive layer in a third opening portion of the first resin layer; and
a first substrate with a second resin layer and a third conductive layer,
wherein the first conductive layer and the second conductive layer are in contact with the first resin layer,
wherein the third conductive layer is electrically connected to the first conductive layer with the layer comprising the conductive particle interposed therebetween, and
wherein the first substrate is over the first resin layer with the second resin layer interposed therebetween.

2. A semiconductor device comprising:
a transistor including a source region and a drain region;
an insulating layer provided over the transistor;
a first conductive layer directly connected to one of the source region and the drain region through a first opening portion in the insulating layer;
a second conductive layer directly connected to the other of the source region and the drain region through a second opening portion in the insulating layer;
a first resin layer over the insulating layer;
a layer comprising a conductive particle directly connected to the first conductive layer in a third opening portion of the first resin layer; and
a first substrate with a second resin layer and a third conductive layer,
wherein the first conductive layer and the second conductive layer are in contact with the first resin layer,
wherein the third conductive layer is electrically connected to the first conductive layer with the second resin layer and the layer comprising the conductive particle interposed therebetween, and
wherein the first substrate is provided over the first resin layer with the second resin layer interposed therebetween.

3. A semiconductor device comprising:
a transistor including a source region and a drain region;
an insulating layer over the transistor;
a first conductive layer directly connected to one of the source region and the drain region through a first opening portion in the insulating layer;
a second conductive layer directly connected to the other of the source region and the drain region through a second opening portion provided in the insulating layer;
a first resin layer over the insulating layer;
a first layer comprising a first conductive particle directly connected to the first conductive layer in a third opening portion of the first resin layer; and
a first substrate with a second resin layer, a third conductive layer, and a second layer comprising a second conductive particle,
wherein the first conductive layer and the second conductive layer are in contact with the first resin layer,
wherein the third conductive layer is electrically connected to the first conductive layer with the second layer comprising the second conductive particle, the second resin layer, and the first layer comprising the first conductive particle interposed therebetween, and
wherein the first substrate is provided over the first resin layer with the second resin layer interposed therebetween.

4. The semiconductor device according to claim 1, wherein the layer comprising the conductive particle comprises a silver particle.

5. The semiconductor device according to claim 2, wherein the layer comprising the conductive particle comprises a silver particle.

6. The semiconductor device according to claim 3, wherein either or both of the first layer comprising the first conductive particle and the second layer comprising the second conductive particle comprise a silver particle.

7. The semiconductor device according to claim 1, wherein the third conductive layer serves as an antenna.

8. The semiconductor device according to claim 2, wherein the third conductive layer serves as an antenna.

9. The semiconductor device according to claim 3, wherein the third conductive layer serves as an antenna.

10. The semiconductor device according to claim 1, wherein the first resin layer comprises a material having an attachment property.

11. The semiconductor device according to claim 2, wherein the first resin layer comprises a material having an attachment property.

12. The semiconductor device according to claim 3, wherein the first resin layer comprises a material having an attachment property.

13. The semiconductor device according to claim 1, wherein the first resin layer comprises one selected from the group consisting of epoxy resin, acrylic resin, and polyimide resin.

14. The semiconductor device according to claim 2, wherein the first resin layer comprises one selected from the group consisting of epoxy resin, acrylic resin, and polyimide resin.

15. The semiconductor device according to claim 3, wherein the first resin layer comprises one selected from the group consisting of epoxy resin, acrylic resin, and polyimide resin.

16. The semiconductor device according to claim 1, wherein the second resin layer comprises a material having an attachment property.

17. The semiconductor device according to claim 2, wherein the second resin layer comprises a material having an attachment property.

18. The semiconductor device according to claim 3, wherein the second resin layer comprises a material having an attachment property.

19. The semiconductor device according to claim 1, wherein the semiconductor device has a function of transmitting and receiving an electromagnetic wave.

20. The semiconductor device according to claim 2, wherein the semiconductor device has a function of transmitting and receiving an electromagnetic wave.

21. The semiconductor device according to claim 3, wherein the semiconductor device has a function of transmitting and receiving an electromagnetic wave.

22. The semiconductor device according to claim 1, further comprising:
a second substrate opposite to the first substrate with the transistor interposed therebetween; and
a third substrate over the first substrate,
wherein each of the second substrate and the third substrate is a flexible substrate.

23. The semiconductor device according to claim 2, further comprising:
a second substrate opposite to the first substrate with the transistor interposed therebetween; and
a third substrate over the first substrate,
wherein each of the second substrate and the third substrate is a flexible substrate.

24. The semiconductor device according to claim 3, further comprising:
a second substrate opposite to the first substrate with the transistor interposed therebetween; and
a third substrate over the first substrate,
wherein each of the second substrate and the third substrate is a flexible substrate.

25. The semiconductor device according to claim 22, wherein surfaces of the second substrate and the third substrate are coated with a conductive material.

26. The semiconductor device according to claim 23, wherein surfaces of the second substrate and the third substrate are coated with a conductive material.

27. The semiconductor device according to claim 24, wherein surfaces of the second substrate and the third substrate are coated with a conductive material.

28. The semiconductor device according to claim 1, wherein the second resin layer is in contact with a side surface of the third conductive layer.

29. The semiconductor device according to claim 1, wherein a side surface of the layer comprising the conductive particle is in contact with the first resin layer and the second resin layer.

30. The semiconductor device according to claim 1, wherein side surfaces of the first conductive layer, the layer comprising the conductive particle, and the third conductive layer are coplanar.

31. The semiconductor device according to claim 1, wherein top surfaces of the first conductive layer and the second conductive layer are coplanar.

32. The semiconductor device according to claim 2, wherein the second resin layer is in contact with a side surface of the third conductive layer.

33. The semiconductor device according to claim 2, wherein a side surface of the layer comprising the conductive particle is in contact with the first resin layer and the second resin layer.

34. The semiconductor device according to claim 2, wherein side surfaces of the first conductive layer, the layer comprising the conductive particle, and the third conductive layer are coplanar.

35. The semiconductor device according to claim 2, wherein top surfaces of the first conductive layer and the second conductive layer are coplanar.

36. The semiconductor device according to claim 3, wherein the second resin layer is in contact with a side surface of the third conductive layer.

37. The semiconductor device according to claim 3, wherein a side surface of the first layer comprising the first conductive particle is in contact with the first resin layer and the second resin layer.

38. The semiconductor device according to claim 3, wherein side surfaces of the first conductive layer, the first layer comprising the first conductive particle, the second layer comprising the second conductive particle, and the third conductive layer are coplanar.

39. The semiconductor device according to claim 3, wherein top surfaces of the first conductive layer and the second conductive layer are coplanar.

* * * * *

UNITED STATES PATENT AND TRADEMARK OFFICE
CERTIFICATE OF CORRECTION

PATENT NO. : 8,508,027 B2  
APPLICATION NO. : 12/555832  
DATED : August 13, 2013  
INVENTOR(S) : Hidekazu Takahashi et al.

Page 1 of 1

It is certified that error appears in the above-identified patent and that said Letters Patent is hereby corrected as shown below:

In the Specification

At column 10, line 58, "150 Mm" should be --150 µm--;

In the Claims

Column 17, line 60, "provided" should be deleted;

Column 18, line 12, "provided" should be deleted;

Column 18, line 23, "provided" should be deleted; and

Column 18, line 38, "provided" should be deleted.

Signed and Sealed this  
Tenth Day of December, 2013

Margaret A. Focarino  
*Commissioner for Patents of the United States Patent and Trademark Office*